United States Patent
Maunder et al.

(10) Patent No.: US 11,290,129 B2
(45) Date of Patent: Mar. 29, 2022

(54) POLAR ENCODER, COMMUNICATION UNIT, INTEGRATED CIRCUIT AND METHOD THEREFOR

(71) Applicants: ACCELERCOMM LTD, Southampton (GB); Robert Maunder, Southampton (GB); Matthew Brejza, Southampton (GB); Shida Zhong, Southampton (GB); Isaac Andrade, Southampton (GB); Taihai Chen, Southampton (GB)

(72) Inventors: Robert Maunder, Southampton (GB); Matthew Brejza, Southampton (GB); Shida Zhong, Southampton (GB); Isaac Andrade, Southampton (GB); Taihai Chen, Southampton (GB)

(73) Assignee: Accelercomm Limited, Southampton (GB)

( * ) Notice: Subject to any disclaimer, the term of this patent is extended or adjusted under 35 U.S.C. 154(b) by 274 days.

(21) Appl. No.: 16/622,894

(22) PCT Filed: Jun. 12, 2018

(86) PCT No.: PCT/EP2018/065532
§ 371 (c)(1),
(2) Date: Dec. 13, 2019

(87) PCT Pub. No.: WO2018/229064
PCT Pub. Date: Dec. 20, 2018

(65) Prior Publication Data
US 2020/0220559 A1    Jul. 9, 2020

(30) Foreign Application Priority Data
Jun. 15, 2017    (GB) .................................. 1709502

(51) Int. Cl.
*H03M 13/00* (2006.01)
*H03M 13/11* (2006.01)
(Continued)

(52) U.S. Cl.
CPC ....... *H03M 13/1191* (2013.01); *H03M 13/13* (2013.01); *H04B 1/40* (2013.01)

(58) Field of Classification Search
CPC .......................... H03M 13/1191; H03M 13/13
See application file for complete search history.

(56) References Cited

U.S. PATENT DOCUMENTS 9,209,832 B2 * 12/2015 Alhussien ......... H03M 13/6362
10,075,193 B2 * 9/2018 Gross ................. H03M 13/1111
(Continued)

FOREIGN PATENT DOCUMENTS

KR    10-2012-0054571 A1    5/2012

OTHER PUBLICATIONS

Noam Presman, Ofer Shapira, Simon Litsyn; Polar Codes with Mixed-Kernels; Subjects: Information Theory; Citeas: arXiv: 1107. 0478 (or arXiv: 1107.0478v3 forth is version); Mar. 24, 2015 (Year: 2015).*

(Continued)

*Primary Examiner* — Esaw T Abraham
(74) *Attorney, Agent, or Firm* — Optimus Patents US, LLC

(57) ABSTRACT

A polar encoder kernel, a communication unit, an integrated circuit and a method of polar encoding are described. The polar encoder kernal is configured to receive one or more bits from a kernal information block having a kernal block size of N; and output one or more bits from a kernal encoded block having a block size that matches the kernal block size N; wherein the polar encoder kernal comprises a decomposition of a polar code graph having multiple columns that are (Continued)

processed by a reused single datapath, at least one of said multiple columns contains two or more stages and where each column of the multiple columns is further decomposed into one or more polar code sub-graphs and is configured to process encoded bits one polar code sub-graph at a time.

20 Claims, 13 Drawing Sheets

(51) Int. Cl.
*H03M 13/13* (2006.01)
*H04B 1/40* (2015.01)

(56) References Cited

U.S. PATENT DOCUMENTS

| | | | |
|---|---|---|---|
| 10,171,204 B2* | 1/2019 | Wu | H03M 13/2792 |
| 10,193,578 B2* | 1/2019 | Gross | H03M 13/09 |
| 10,312,946 B2* | 6/2019 | Wang | H03M 13/3784 |
| 10,313,056 B2* | 6/2019 | Koike-Akino | H03M 13/356 |
| 2015/0333775 A1 | 11/2015 | Korb et al. | |
| 2016/0013810 A1* | 1/2016 | Gross | H03M 13/13 714/776 |
| 2017/0364399 A1* | 12/2017 | Shi | H03M 13/618 |
| 2017/0366199 A1* | 12/2017 | Ge | H04L 1/0053 |
| 2017/0366204 A1* | 12/2017 | Shi | H04L 25/061 |
| 2017/0366205 A1* | 12/2017 | Zhang | H03M 13/635 |
| 2017/0366206 A1* | 12/2017 | Zhang | H04L 1/0069 |

OTHER PUBLICATIONS

Yoo Hoyoung et al: "Partially Parallel Encoder Architecture for Long Polar Codes" IEEE Transactions on Circuits and Systems II: Express Briefs, IEEE US, vol. 621 No. 3, Mar. 2015 (Mar. 2015) pp. 306-310 XP011574098 ISSN: 1549-7747 DOI: 10.1109/TCSII.2014. 2369131 [retrieved on Feb. 27, 2015] the whole document.

Gabi Sarkis et al: "Flexible and Low-Complexity Encoding and Decoding of Systematic Polar Codes", IEEE Transactions on Communications, Jan. 2016 (Jan. 2016), pp. 2732-2745, XP055336370, New York DOI: 10.1109/TCOMM.2016.2574996 Retrieved from the Internet: URL:https://arxiv.org/pdf/1507.03614v3.pdf Y the whole document.

Shih Xin-Yu et al: "High-speed low-area-cost VLSI design of polar codes encoder architecture using radix-k processing engines", 2016 IEEE 5th Global Conference on Consumer Electronics, IEEE, Oct. 11, 2016 (Oct. 11, 2016), pp. 1-2, XP033032313, DOI: 10.1109/GCCE.2016.7800526 the whole document.

Vangala Harish et al: "A new multiple folded successive cancellation decoder for polar codes", 2014 IEEE Information Theory Workshop (ITW 2014), IEEE, Nov. 2, 2014 (Nov. 2, 2014), pp. 81-385, XP032694569, ISSN: 1662-9019, DOI: 10.1109/ITW.2014. 6970858 [retrieved on Dec. 1, 2014]section III, sub-section "Folding Operation at the Encoder";figure 2.

Sebastian Cammerer et al: "Scaling Deep Learning-based Decoding of Polar Codes via Partitioning", Feb. 22, 2017, pp. 1-4.

* cited by examiner

POLAR ENCODER, COMMUNICATION UNIT, INTEGRATED CIRCUIT AND METHOD THEREFOR

FIELD OF THE INVENTION

The field of the invention relates to a polar encoder, a communication unit, an integrated circuit and a method for polar encoding. The invention is applicable to, but not limited to, polar encoding for current and future generations of communication standards.

BACKGROUND OF THE INVENTION

In accordance with the principles of Forward Error Correction (FEC) and channel coding, polar coding [1] may be used to protect information against the effects of transmission errors within an imperfect communication channel, which may suffer from noise and other detrimental effects. More specifically, a polar encoder is used in the transmitter to encode the information and a corresponding polar decoder is used in the receiver to mitigate transmission errors and recover the transmitted information. The polar encoder converts an information block comprising K bits into an encoded block comprising a greater number of bits M>K, according to a prescribed encoding process. In this way, the encoded block conveys the K bits of information from the information block, together with M−K bits of redundancy. This redundancy may be exploited in the polar decoder according to a prescribed decoding process, in order to estimate the values of the original K bits from the information block. Provided that the condition of the communication channel is not too severe, the polar decoder can correctly estimate the values of the K bits from the information block with a high probability.

The polar encoding process comprises three steps. In a first information block conditioning step, redundant bits are inserted into the information block in prescribed positions, in order to increase its size from K bits to N bits, where N is a power of two. In a second polar encoding kernal step, the N bits of the resultant kernal information block are combined in different combinations using successive eXclusive OR (XOR) operations, according to a prescribed graph structure. This graph structure comprises $n=\log_2(N)$ successive stages, each comprising N/2 XOR operations, which combine particular pairs of bits. In a third step, encoded block conditioning is applied to the resultant kernal encoded block, in order to adjust its size from N bits to M bits. This may be achieved by repeating or removing particular bits in the kernal encoded block according to a prescribed method, in order to produce the encoded block.

A flexible polar encoder kernal is required to support various kernal block sizes N, each having a value that is a power of two, up to and including a maximum supported kernal block size $N_{max}$. The prior art flexible polar encoder kernals of [7], [8] decompose the polar code graph into several rows, which span the width of the graph. The polar encoder kernal operation comprises several steps, during which each successive column is processed one after another, in order from top to bottom. However, the amount of hardware required and the critical path length through that hardware depends on the maximum number of stages $n_{max}=\log_2(N_{max})$ that must be spanned by each row. When encoding short blocks, much of the hardware will be unused, resulting in poor hardware efficiency.

SUMMARY OF THE INVENTION

The present invention provides a polar encoder, a communication unit and a method for polar encoding, as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the FIG's are illustrated for simplicity and clarity and have not necessarily been drawn to scale.

DETAILED DESCRIPTION

Figure 1:
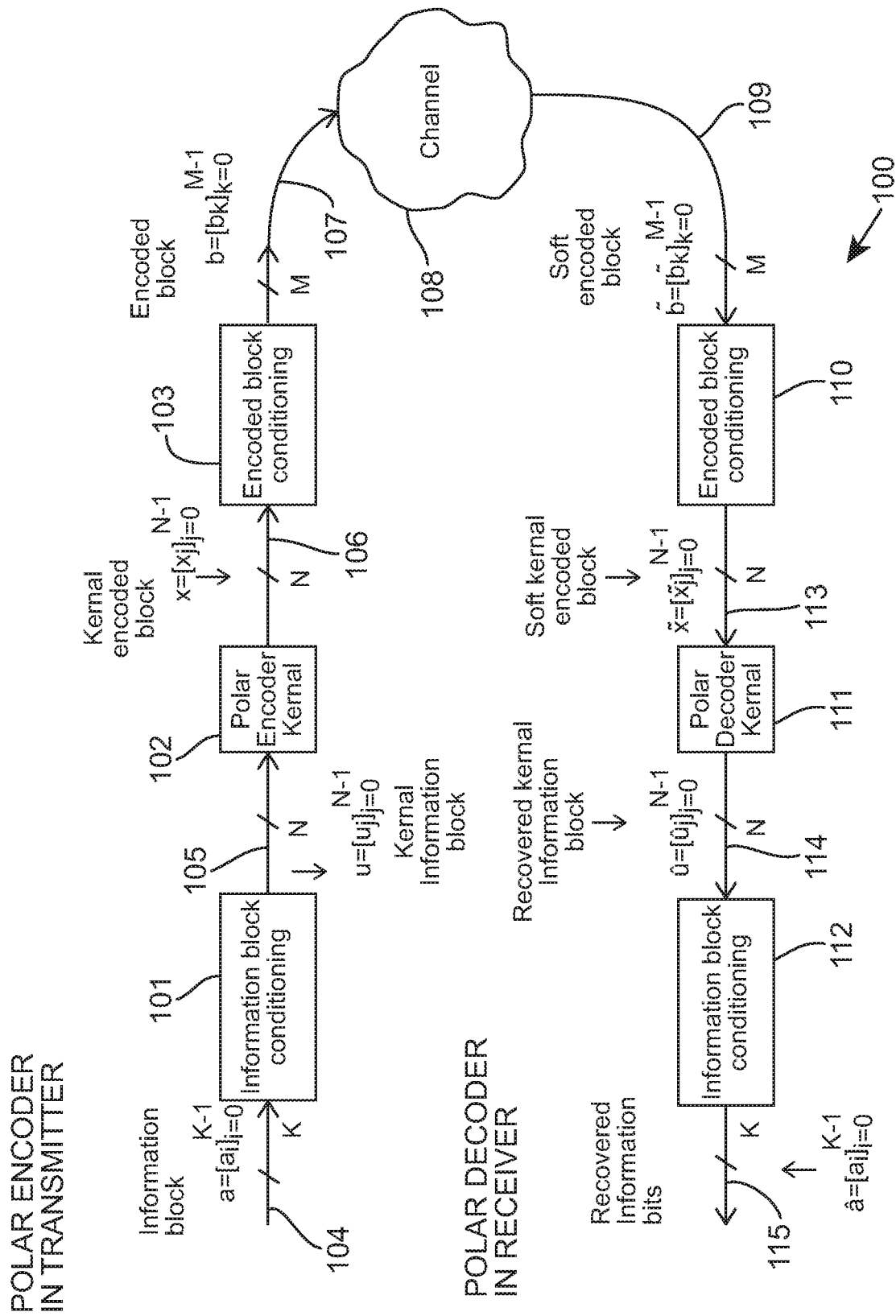
FIG. 1 illustrates an example top-level schematic of a communication unit having a polar encoder and polar decoder, adapted according to example embodiments of the invention.

In a first aspect, examples of the present invention describe a polar encoder kernal configured to receive one or more bits from a kernal information block having a kernal block size of 'N'; and output one or more bits from a kernal encoded block having a block size that matches the kernal block size 'N'; wherein the polar encoder kernal comprises a decomposition of a polar code graph into multiple columns, which are further decomposed into one or more polar code sub-graphs and is configured to perform the processing associated with one polar code sub-graph at a time.

Although this approach requires a greater number of steps to complete the polar encoder kernal operation than the prior art, the amount of hardware required and the critical path length in examples of the present invention depends only on the maximum number of stages in a column, rather than on the maximum number of stages in the polar code graph, as in the prior art. This ensures that a high utility of the hardware is maintained for all kernal block sizes, achieving superior hardware efficiency to the prior art.

In some examples, the polar encoder kernal may include a datapath, memory blocks and a controller, wherein the controller is configured to, when performing the processing associated with each polar code sub-graph read $n_e$ bits from a first memory block of the memory or from a bit input to the polar encoder kernal, use the datapath (601) to process the $n_e$ bits and write the resultant $n_e$ bits to a second memory block. In this manner, the processing associated with each polar-code sub-graph may be completed within a single step of the encoding process. Furthermore, the datapath may be utilised in every step of the encoding process, thereby maintaining a high hardware utility, irrespective of the kernal block size.

In some examples, the polar encoder kernal may be configured to perform the processing associated with all of the polar code sub-graphs within each successive column before advancing to the next column of the polar code graph in order, from left to right. In this manner, the data dependencies of the polar encoder kernal may be satisfied without requiring the datapath to have a large amount of hardware with a high critical path length, which would be necessary in order to complete the processing associated with spanning the maximum supported number stages in the polar code graph.

In some examples, the processing associated with each column may be completed by reading from a first memory block and writing into a second memory block, with the roles of the first memory block and second memory block alternating for successive columns. In this manner, there is no need to copy memory contents from one memory to the other, which would be required if the datapath was configured to always read from one memory and always write to the other memory.

In some examples the one or more sub-graphs in each column may be configured to span the width of the column. In this manner, the datapath requires only a small amount of hardware with a small critical path length, in order to complete the processing associated with spanning only the stages in the column.

In some examples the one or more sub-graphs within each column are configured to span the width of the column. In some examples, the one or more sub-graphs within each column may be processed by the datapath one at a time, spread over a corresponding number of successive processing steps. In this manner, the block size of the datapath may be configured at design-time, in order to optimise the trade-off between the hardware requirement and the number of clock cycles required to complete the polar encoder kernal process.

In some examples a number of decomposed sub-graphs in each column may be dependent on the block size of the datapath $n_e$, where the block size of each sub-graph is equal to the block size of the datapath $n_e$, such that the datapath is able to process the sub-graph in a single step. In some examples, a maximum number of decomposed sub-graphs in each column is max(N/n_e,1), and when N<$n_e$, at least one zero-valued bit is appended onto an end of the kernal information block to increase its length to $n_e$. In some examples, the at least one zero-valued bit is subsequently removed from the end of the kernal encoded block, to return its length to N. In this manner, the processing of longer kernal block sizes may be spread over a greater number of clock cycles, while the processing of shorter kernal block sizes may be spread over a lower number of clock cycles, maintaining a consistent hardware efficiency.

In some examples the polar code graph may be composed of a number (n=log 2(N)) of stages that are grouped into a number (C) of columns, where each column includes a number of consecutive stages. In some examples, the 'n' stages (207) may be distributed among the (C) columns using any combination that satisfies $s_c \leq s_e$ for all c∈[0, C−1], where $s_e$ specifies the maximum number of stages supported by the datapath. In some examples, the number of columns $s_c=s_e$ for all but the right-most column, and where all remaining stages are placed into a right-most column. In this manner, the hardware requirement of the datapath depends on the maximum number of stages in each column, which may be configured at design-time, in order to optimise the trade-off between the hardware requirement and the number of clock cycles required to complete the polar encoder kernal process.

In some examples, the datapath and memory, may have the same bit widths. In some examples, a bit width of an input and a bit width of an output of the polar encoder kernal may be selected independently from at least one of: each other, the datapath and memory. In this manner, the width of the interfaces between the polar encoder kernal and other connected circuits may be selected independently of the datapath and memory widths, which dictate the hardware requirement of the polar encoder kernal, as well as the number of clock cycles required to complete the polar encoder kernal processing.

In some examples, the datapath may include at least one of: (i) a vertical concatenation of $n_e/2^{s_e}$ graphical representations of a first generator matrix $F^{z,900\ s_e}$ having dimensions that depend on the number of datapath stages $s_e$, and (ii) the left-most $s_e$ stages in a graphical representation of a second generator matrix $F^{\otimes log_2(n_e)}$ having dimensions that depend on the datapath block size $n_e$. In some examples, the datapath may include a total of $s_e n_e/2$ XOR gates configured to propagate bits from a left edge of the datapath to a right edge, through $s_e$ datapath stages to a right edge, along paths having a critical length comprising $s_e$ XOR gates. In some examples, a number of right-most stages in the datapath may be disabled when performing processing associated with columns in which the number of stages $s_c$ is smaller than a number of datapath stages $s_e$. In this manner, the processing associated with each sub-graph in each column may be completed within a single clock cycle.

In some examples, the processing associated with each successive column by the polar encoder may be performed by alternating between (i) reading from the first memory block and writing into the second memory block and (ii) reading from the second memory block and writing into the first memory block. In this manner, the bits that are written to one memory block during the processing of one column may be read from the same memory block during the processing of the next column to the right, without the requirement to copy bits from one memory block to the other.

In some examples the datapath may be configured such that after writing to a first memory block during the processing associated with a first column, it reads from that same memory block during a subsequent processing associated with a second column immediately to the right of the first column. In this manner, there is no requirement to copy bits from one memory block to the other, as would be required if the datapath always wrote to one memory and read from the other memory.

In some examples, an input to the datapath may be read from the first memory block and an output of the datapath may be written to the second memory block. In some examples, the processing of each column by the polar encoder may be performed in a complementary manner by multiplexing read data ports of the first memory block with corresponding read data ports in second memory block. In this manner, the datapath may read from either memory block, according to a selection made using the multiplexer control signal.

In some examples, the controller may provide individual write-enable signals to control whether each of the $n_e$ bits provided by the datapath is written individually into the first memory block or second memory block. In this manner, the datapath may write to either memory block, according to a select made by asserting one or other of the write-enable signals. In some examples the write enable signals used for the first memory block may be shared with the second memory block, but masked alternately when processing alternate columns. In this manner, the write enable signals may be controlled independently of which column is being processed, then shared and masked depending on which column is being processed.

In some examples, the information block conditioning circuit may be configured to: receive one or more bits from an information block of data, having a block size of K to be encoded; generate redundant bits and interlace the redundant bits into positions that are known by a polar decoder; and output one or more bits from the kernal information block having a block size of N to the polar encoder kernal. In some examples, the kernal information block (105) may be a vector:
$u=[u_j]_{j=0}^{N-1}$ comprising N kernal information bits and where $u_j \in \{0,1\}$.

In some examples, the polar encoder kernal may be coupled to an information block conditioning circuit configured to convert information bits into the kernal information block that is input to the polar encoder kernal. In some examples, the information block conditioning circuit may be configured to interlace the information bits with frozen bits, Cyclical Redundancy Check (CRC) bits, Parity Check (PC)- frozen bits, User Equipment Identification (UE-ID) bits, and/or hash bits, for example. In this manner, the number of polar information bits can adopt any integer value, without the requirement to be a power of two.

In some examples, the polar encoder kernal may be coupled to an encoded block conditioning circuit configured to generate encoded bits from the kernal encoded block output by the polar encoder kernal. In some examples, the encoded block conditioning circuit may be configured to use puncturing to remove a number of the 'N' bits in the kernal encoded block, or shortening to remove a number of the 'N' bits that are guaranteed to have logic values of '0' in the kernal encoded block, or repetition to repeat a number of the 'N' bits in the kernal encoded block. In this manner, the number of polar encoded bits can adopt any integer value, without the requirement to be a power of two. In some examples, at least one of the information block conditioning circuit and the encoded block conditioning circuit may be configured to perform interleaving. In some examples, the kernal encoded block may be a vector: $x=[x_j]_{j=0}^{N-1}$ comprising 'N' kernal encoded bits, where $x_j \in \{0,1\}$.

In a second aspect, examples of the present invention describe a communication unit comprising a polar encoder kernel according to the first aspect.

In a third aspect, examples of the present invention describe an integrated circuit comprising a polar encoder kernel according to the first aspect.

In a fourth aspect, examples of the present invention, a method of polar encoding in a communication unit is described according to the first aspect. The method includes: decomposing a polar code graph into multiple columns where each column is further decomposed into one or more polar code sub-graphs; receiving one or more bits from a kernal information block having a kernal block size of N; processing encoded bits one polar code sub-graph at a time; and outputting one or more bits from a kernal encoded block having a block size that matches the kernal block size N.

In a fifth aspect, examples of the present invention describe a non-transitory tangible computer program product comprising executable code stored therein for polar encoding in a communication unit according to the fourth aspect.

Although examples of the invention are described with reference to an information block conditioning circuit configured to output one or more bits from a kernal information block having a block size of N to a polar encoder kernel, such that successive kernal information blocks have kernal block sizes N that can vary from block to block, it is envisaged in other examples that the described polar encoder kernel may operate as an inflexible encoder that only supports one block size of N.

Although examples of the invention are described with reference to an integrated circuit implementation within the application of a wireless communication transmitter, it is envisaged that in other examples, the invention may be applied in other implementations and in other applications. For example, the circuits and concepts herein described may be composed as a hardware implementation within an Application Specific Integrated Circuit (ASIC), an Application Specific Instruction Set Processor, an Application Specific Standard Product, a Field Programmable Gate Array, a General-Purpose Graphical Processing Unit, System on Chip, Configurable Processor, for example. Similarly, it is envisaged that in other examples, a software implementation may be composed within a Central Processing Unit, a Digital Signal Processor or a microcontroller, for example. Besides wireless communication transmitters, the invention may be composed into a wireless communication transceiver, or a communication device for other communication channels, such as optical, wired or ultrasonic channels. Furthermore, the invention may be composed into a storage device, in order to provide FEC for data stored on optical, magnetic, quantum or solid-state media, for example.

Examples of the present invention further provide a method and architecture to encode information according to the principles of polar encoding, for the purpose of providing FEC during communication over unreliable channels or during storage in unreliable media. Examples of the present invention further provide a method and architecture to provide flexible support for information blocks that comprise a number of bits that varies from block to block.

In particular, examples of the present invention decompose a polar code graph into several columns, which each comprise a different set of one or more consecutive stages. The columns are processed one after another, in order from left to right. Each column is further decomposed into several sub-graphs, which in some examples span only the width of the column. The processing of each column comprises several steps, during which the sub-graphs within the column are processed one after another.

Some examples of the present invention are described with reference to the New Radio (NR) standard, which is presently being defined by the 3rd Generation Partnership Project (3GPP) as a candidate for 5th Generation (5G) mobile communication. Presently, polar encoding and decoding has been selected to provide FEC in the uplink and downlink control channels of the enhanced Mobile Broad-Band (eMBB) applications of NR, as well as in the Physical Broadcast Channel (PBCH). Polar encoding and decoding has also been identified as candidates to provide FEC for the uplink and downlink data and control channels of the Ultra Reliable Low Latency Communication (URLLC) and massive Machine Type Communication (mMTC) applications of NR. Alternatively, some examples of the invention are described without reference to a particular standardised application. More broadly, the invention may be applied in any future communication standards that select polar encoding and decoding to provide FEC. Furthermore, the invention may be applied in non-standardised communication applications, which may use polar encoding and decoding to provide FEC for communication over wireless, wired, optical, ultrasonic or other communication channels. Likewise, the invention may be applied in storage applications, which use polar encoding and decoding to provide FEC in optical, magnetic, quantum, solid state and other storage media.

In some examples, the circuits and functions herein described may be implemented using discrete components and circuits, whereas in other examples the operations may be performed in a signal processor, for example in an integrated circuit.

Because the illustrated embodiments of the present invention may, for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

DETAILED DESCRIPTION OF FIGURES

Referring now to FIG. 1, a top-level schematic of a communication unit 116 that includes a polar encoder and polar decoder is illustrated, adapted according to examples of the invention. In this example of a communication unit 116, a skilled artisan will appreciate that a number of other components and circuits (such as frequency generation circuits, controllers, amplifiers, filters, etc.) are not shown for simplicity purposes only. In other examples, it is envisaged that the block 116 may take the form of an integrated circuit comprising the polar encoder (and in some instances the block conditioning and polar decoding processing functionality) as well, for example for use in a communication unit, storage unit or any electronic device that is designed to use polar encoding. In other examples, it is envisaged that the block 116 may take the form of software running on a general purpose computation processor.

A polar encoder comprises three successive components, namely information block conditioning 101, the polar encoder kernal 102 and encoded block conditioning 103. These components are discussed in the following paragraphs. In order to provide context to the present discussion, FIG. 1 illustrates the communication or storage channel 108, as well as the corresponding components of the polar decoder, namely the information block conditioning 112, the polar decoder kernal 111 and the encoded block conditioning 110, although these are operated in the reverse order. As will be discussed in the following paragraphs, the encoder operates on the basis of an information block 104, kernal information block 105, kernal encoded block 106 and encoded block 107. Correspondingly, the polar decoder operates on the basis of a recovered information block 115, recovered kernal information block 114, soft kernal encoded block 113 and soft encoded block 109, although these are processed in the reverse order.

The input to the information block conditioning component 101 may be referred to as an information block 104, having a block size of K. More specifically, this information block is a row vector $a=[a_i]_{i=0}^{K-1}$ comprising K information bits, where $a_i \in \{0,1\}$. In some alternative examples, the information block may be a column vector. The information block conditioning component 101 interlaces the K information bits with N−K redundant bits, which may be frozen bits [1], Cyclical Redundancy Check (CRC) bits [2], Parity Check (PC)-frozen bits [3], User Equipment Identification (UE-ID) bits [4], or hash bits [5], for example. Here, frozen bits may always adopt a logic value of '0', while CRC or PC-frozen bits or hash bits may adopt values that are obtained as functions of the information bits, or of redundant bits that have already been interlaced earlier in the process. The information block conditioning component 101 generates redundant bits and interlaces them into positions that are identified by a prescribed method, which is also known to the polar decoder. The information block conditioning component 101 may also include an interleaving operation, which may implement a bit-reversal permutation [1] for example. The output of the information block conditioning component 101 may be referred to as a kernal information block 105, having a block size of N. More specifically, this kernal information block 105 is a row vector $u=[u_j]_{j=0}^{N-1}$ comprising N kernal information bits, where $u_j \in 0,1$. In some alternative examples, the kernal information block may be a column vector. Here, the information block conditioning must be completed such that N is a power of 2 that is greater than K, in order to provide compatibility with the polar encoder kernal, which operates on the basis of a generator matrix having dimensions that are a power of 2, as will be discussed below. The input to the polar encoder kernal 102 is a kernal information block u 105 and the output of the polar encoder kernal 102 may be referred to as a kernel encoded block 106, having a block size that matches the kernal block size N. More specifically, this example kernal encoded block 106 is a row vector: $x=[x_j]_{j=0}^{N-1}$ comprising N kernal encoded bits, where $x_j \in 0,1$. In some alternative examples, the kernal encoded block may be a column vector. In the case where row vectors are used, the kernal encoded block 106 is obtained according to the modulo-2 matrix multiplication $x=uF^{\otimes n}$, where the modulo-2 sum of two bit values may be obtained as their XOR. Here, the generator matrix $F^{\otimes n}$ is given by the [n=log 2(N)]th Kronecker power of the kernal matrix:

$$F = \begin{bmatrix} 1 & 0 \\ 1 & 1 \end{bmatrix}.$$

Note that successive Kronecker powers of the kernal matrix may be obtained recursively, where each power $F^{\otimes n}$ is obtained by replacing each logic '1' in the previous power $F^{\otimes(n-1)}$ with the kernal matrix and by replacing each logic '0' with a 2×2 zero matrix. Accordingly, the $n^{th}$ Kronecker power $F^{\otimes n}$ of the kernal matrix has dimensions of $2^n \times 2^n$. For example, $$F^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix}, F^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}.$$

Here, u=[1011] gives $x=uF^{\otimes 2}=[1101]$ and u=[11001001] gives $x=uF^{\otimes 3}=[00110111]$.

A skilled artisan will appreciate that the level of integration of circuits or components may be, in some instances, implementation-dependent. Furthermore, it is envisaged in some examples that a signal processor may be included in a communication unit 116 and be adapted to implement the encoder and decoder functionality. Alternatively, a single processor may be used to implement a processing of both transmit and receive signals, as shown in FIG. 1, as well as some or all of the baseband/digital signal processing functions. Clearly, the various components, such as the described polar encoder, within a wireless or wired communication unit 116 can be realized in discrete or integrated component form, with an ultimate structure therefore being an application-specific or design selection.

Figure 2:
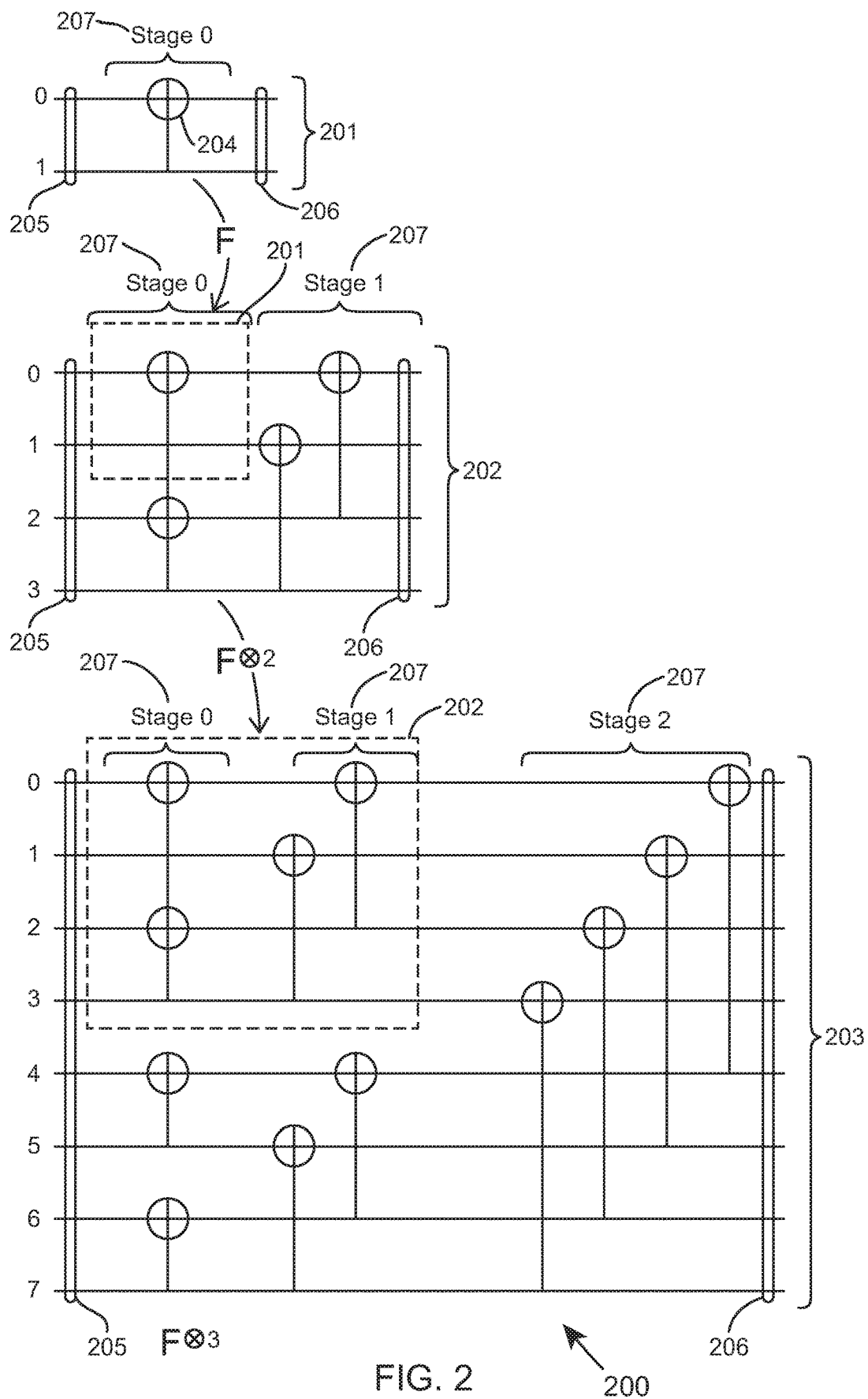
FIG. 2 illustrates an example graphical representation of the generator matrices F, $F^{\otimes 2}$ and $F^{\otimes 3}$, according to example embodiments of the invention.

In some examples, the operation of the polar encoder kernal 102 may be represented by a graphical representation 201, 202, 203 of the generator matrix $F^{\otimes n}$, which is exemplified in FIG. 2. Referring now to FIG. 2 an example graphical representation 200 of the generator matrices F 201, $F^{\otimes 2}$ 202 and $F^{\otimes 3}$ 203 are illustrated according to examples of the invention.

The graphical representation of a generator matrix $F^{\otimes n}$ comprises a network of N log 2(N)/2 modulo-2 additions, which are connected to each other, as well as to a set of $N=2^n$ information connections along the height of the graphical representation's left-hand edge and to a set of N encoded connections along the height of its right-hand edge. From left-to-right, the modulo-2 additions are arranged in to a series of n stages, which each has N connections on each of its left and right-hand edges to either another stage, or to the left or right hand edge of the graphical representation. Each stage horizontally connects each of the connections on its left-hand edge to the corresponding horizontally-aligned connection on its right hand edge, either directly, or via a modulo-2 addition, which is vertically connected to a horizontal connection lower in the stage. Each stage comprises a total of N/2 vertically-aligned modulo-2 additions. In the present invention, the set of n stages is grouped into C<n columns, where each column comprises a different non-overlapping set of consecutive stages.

The graphical representations 201, 202, 203 of the generator matrix $F_{\otimes n}$ are examples of small polar code graphs, whereas in general, the polar code graphs may be much bigger and have any dimension n>0. Thus, the example in FIG. 2 illustrates a much more simplified arrangement than exists in practice, purely for the purpose of explanation and not to obfuscate the description of the invention.

Here, each modulo-2 addition ⊗ 204 may be implemented using a binary eXclusive-OR (XOR) operation. Note that the graph comprises 'N' inputs on its left edge 205 and 'N' outputs on its right edge 206, corresponding to the 'N' kernal information bits of 'u' 105 and the 'N' kernal encoded bits of 'x' 106. The graphical representations of the generator matrices F 201, $F^{\otimes 2}$ 202 and $F^{\otimes 3}$ 203 comprise n=log 2(N) stages 207, each of which comprises N/2 vertically aligned XORs 204, giving a total of N log 2(N)=2 XORs. Note that there are data dependencies between successive stages 207 that enforce a left to right processing schedule. More specifically, the data dependencies prevent the computation of the XORs in a particular stage 207 until after the XORs in the stage 207 to its left have been computed.

In some examples, in common with the recursive nature of successive Kronecker powers $F^{\otimes n}$, successive graphical representations of these generator matrices also have recursive relationships. More specifically, the graphical representation 200 for a polar encoding kernal operation having a kernal block size of N=2 201 comprises a single stage 207, containing a single XOR 204. Notably, in the example polar encoder, the first of the N=2 kernal encoded bits is obtained as the XOR of the N=2 kernal information bits, while the second kernal encoded bit is equal to the second kernal information bit. For greater kernel block sizes 'N', the graphical representation may be considered to be a vertical concatenation of two graphical representations for a kernal block size of N/2, followed by an additional stage 207 of XORs. In analogy with the N=2 kernal described above, the first N/2 of the N kernal encoded bits are obtained as XORs of corresponding bits from the outputs of the two N/2 kernals, while the second N/2 of the kernal encoded bits are equal to the output of the second N/2 kernal.

In this example, the input to the encoded block conditioning component 103 of the polar encoder is a kernal encoded block x 106 and its output may be referred to as an encoded block 107, having a block size of M. More specifically, this encoded block is a row vector comprising M encoded bits $b=[b_k]_{k=0}^{M-1}$, where $b_k \in \{0,1\}$. In some alternative examples, the encoded block may be a column vector.

Here, the resultant polar coding rate is given by R=K/M, where the encoded block conditioning 103 must be completed such that 'M' is greater than 'K'. The encoded block conditioning component 103 may use various techniques to generate the 'M' encoded bits in the encoded block b 107, where 'M' may be higher or lower than 'N'. More specifically, repetition [6] may be used to repeat some of the 'N' bits in the kernel encoded block 'x', while shortening or puncturing techniques [6] may be used to remove some of the 'N' bits in the kernel encoded block 'x'. Note that shortening removes bits that are guaranteed to have logic values of '0', while puncturing removes bits that may have either of logic '0' or '1' values. The encoded block conditioning component may also include an interleaving operation. Following polar encoding, the encoded block 'b' 107 may be provided to a modulator, which transmits it over a communication channel 108.

Figure 3:
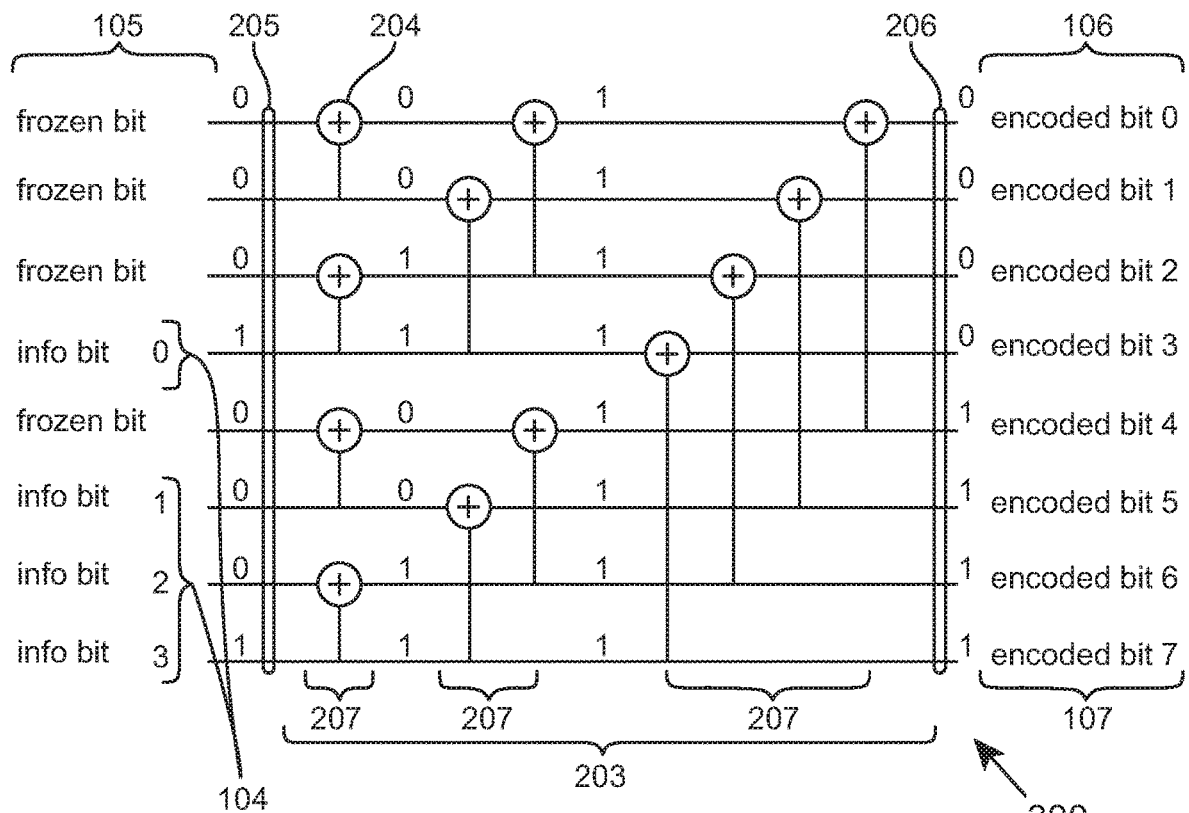
FIG. 3 illustrates an example polar encoding process, using the graphical representation of the generator matrix $F^{\otimes 3}$, illustrating the case where a particular frozen bit pattern is used to convert the K=4 information bits a=[1001] into the M=8 encoded bits b=[00001111], according to example embodiments of the invention.

Referring now to FIG. 3 an example polar encoding process, using an extension of the graphical representation 300 of the generator matrix $F^{\otimes 3}$ 203, illustrates the example where a particular frozen bit pattern is used to convert the K=4 information bits a=[1001] 104 into the M=8 encoded bits b=[00001111] 107. More specifically, information block conditioning 101 is used to convert the K=4 information bits a=[1001] 104 into the N=8 kernal information bits u=[00010001] 105. These are then converted into the N=8 kernal encoded bits x=[00001111] 106 by the polar encoder kernal 102 using the polar code graph 203. Here, the input paths can be traced through the various XOR operations to identify the output. Finally, encoded block conditioning 103 preserves all kernal encoded bits, to provide the M=8 encoded bits b=[00001111] 107.

Figure 4:
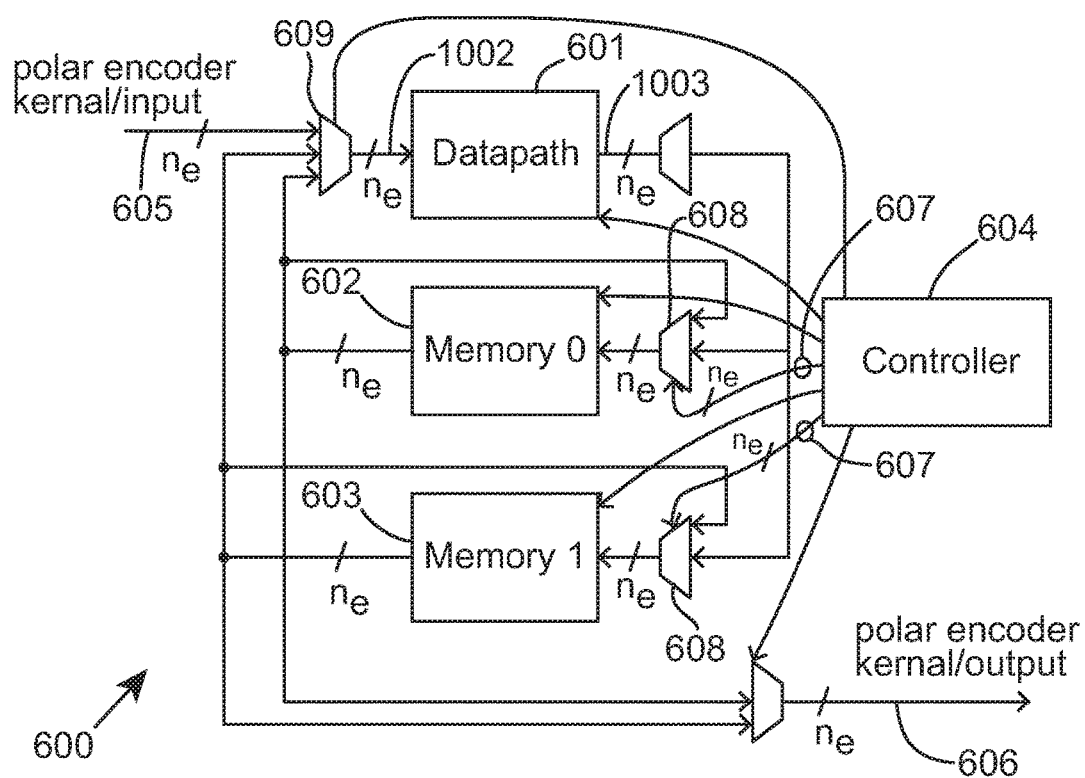
FIG. 4 illustrates an example schematic of the proposed polar encoder kernal, according to example embodiments of the invention.

Encoder Architecture Example:

Referring now to FIG. 4, an example schematic of the proposed polar encoder kernal 600 is illustrated, according to example embodiments of the invention. The proposed polar encoder kernal 102 comprises a datapath 601, two memory blocks 602, 603 and a controller 604. In contrast to known processor architectures for implementing an encoder, examples of the present invention describe the processing of each column by reading from one memory and writing into the other, with the roles of the two memories alternating for successive columns. Each column may include one or more stages of the polar code graph. Furthermore, the processing is spread over successive clock cycles, depending on the block size of the datapath.

In contrast to the known polar encoders, examples of the present invention decompose the polar code graph into several columns, which each comprise a different set of one or more consecutive stages. The columns are processed one after another, in order from left to right. Each column is further decomposed into several sub-graphs, where, in some examples, the one or more sub-graphs within each column are each configured to span the width of the column.

In some examples, the sub-graphs within a particular column contain mutually exclusive sets of XORs and interconnections, where any particular XOR or interconnection within a particular sub-graph is not connected to any XOR or interconnections in any other sub-graph in the same column. The processing of each column comprises several steps, during which the sub-graphs within the column are processed one after another, one sub-graph at a time. This is in contrast to the prior art of [7], [8], which decomposes the polar code graph into only a single column, comprising several rows, which are processed one after another, in order from top to bottom.

While the present invention requires a greater number of steps to complete the polar encoder kernal operation, the amount of hardware required and the critical path length depends only on the maximum number of stages in a column, rather than on the maximum number of stages in the polar code graph, as in the prior art. This ensures that a high utility of the hardware is maintained for all block sizes, achieving superior hardware efficiency to the prior art.

Under the control of the controller 604, the datapath 601 is directed to process one sub-graph of one column in each step of the polar encoder kernal operation. More specifically, the input to the datapath 601 is read from one of the two memory blocks 602, 603 and the output of the datapath 601 is written to the other of the two memory blocks 602, 603. Here, the roles of the two memory blocks alternate during the processing of successive columns, such that the memory block that is written to during the processing of one column is read from during the processing of the next column. The bits are arranged within these memory blocks 602, 603 in a manner that allows the datapath 601 to perform seamless read and write operations, without the requirement for complex interconnection networks or complex control signals.

The proposed polar encoder kernal 600 enables the flexible encoding of one kernal information block 105 at a time, where successive kernal information blocks can have kernal block sizes N that can vary from block to block. More specifically, the kernal block size N can adopt the value of any power of two between 2 and Nmax, where Nmax is a parameter that is fixed at design time.

At the start of the polar encoding process, the kernal information block $u=[u_j]_{j=0}^{N-1}$ (say kernal information block 105 from FIG. 1) is provided to the bit input 605 of the polar encoder kernal 102, over a series of $N/\min(N; n_e)$ consecutive steps. The bit input has a width that can accept $n_e$ bits in each step, where the parameter $n_e$ is fixed at design time. In the example where $N<n_e$, zero-valued bits are appended to the end of the kernal information block before it is provided to the proposed polar encoder kernal 600, in order to increase its length to $n_e$. Following the completion of the polar encoding process, a series of $N/\min(N,n_e)$ consecutive steps is used to output one or more bits from the kernal encoded block $x=[x_j]_{j=0}^{N-1}$ 106 on the bit output 606 of the proposed polar encoder kernal 600, which also has a width of $n_e$ bits. In the example where $N<n_e$, zero-valued bits may be removed from the end of the output of the polar encoder kernal 600.

In a first example, the input 605 and output 606 of $n_e$ the polar encoder kernal 600 may be configured to have the same width of bits as the memory 602, 603 and datapath 601. In a second example, however, it is envisaged that the input 605 and output 606 of the polar encoder kernal 600 may be configured to have different widths to the memory 602, 603 and datapath 601 components, thereby allowing the width of the interfaces with the information and encoded block conditioning components 101, 103 to be selected independently of the datapath 601 width. This allows the hardware resources and number of clock cycles consumed by the block conditioning components 101, 103 and the polar encoder kernal 102 to be separately optimised.

Figure 5:
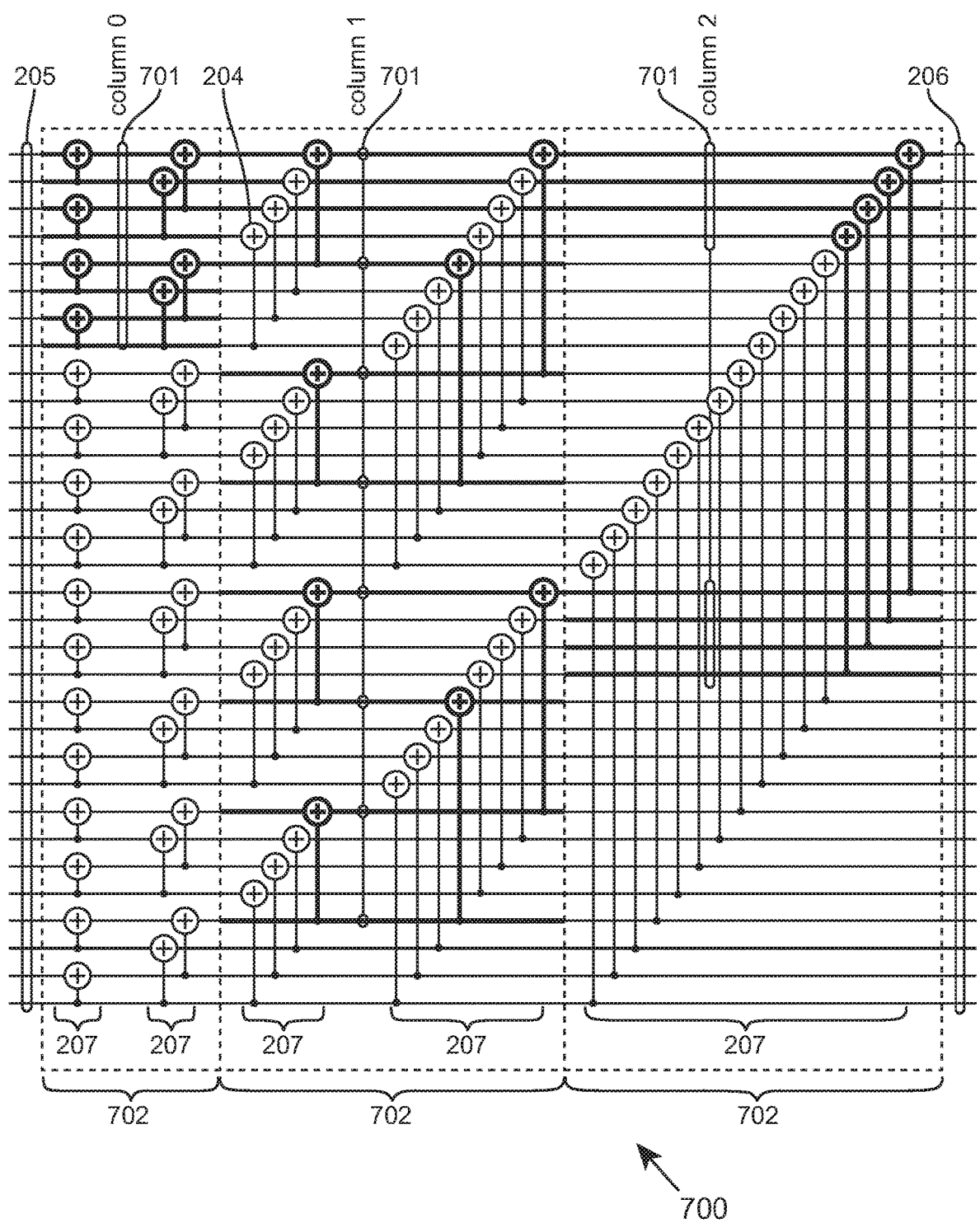
FIG. 5 illustrates an example graphical representation of the generator matrix $F^{\otimes 5}$, which has been grouped into C=3 columns comprising s=[2; 2; 1] stages, which corresponds to $s_e=2$, according to example embodiments of the invention.

Referring now to FIG. 5, an example graphical representation of the generator matrix $F^{\otimes 5}$, which has been grouped into C=3 columns comprising s=[2; 2; 1] stages, which corresponds to $s_e=2$ is illustrated, according to example embodiments of the invention. Here, $n_e=8$, which results in each column being decomposed into $N/n_e=4$ sub-graphs, providing a total of 12 sub-graphs across C=3 columns. Each column 702 is enclosed in a green box. The first sub-graph 701 in each column is highlighted in bold.

When encoding a kernal information block 105 having a block size of N, the proposed polar encoder kernal 600 operates on the basis of a graphical representations of the polar code generator matrix, as described above. Here, the n=log 2(N) stages 207 within the graphical representations are grouped into a number C of columns, where each column 702 comprises a particular number of consecutive stages 207. Each column 702 may be referred to by its index c∈[0, C−1], where the left-most column has the index c=0 and the right-most column has the index c=C−1. The number of stages 207 in each column may be expressed using the row vector s=$[s_c]_{c=0}^{C-1}$, where $s_0$ is the number of stages in the left-most column and $s_{C-1}$ is the number of stages in the right-most column. Here, the vector s must be chosen such that: $\Sigma_{c=0}^{C-1} s_c = n$. To be more explicit, each stage 207 in the polar code graph comprises N/2 XORs 204, which may be reordered horizontally without changing the fundamental connectivity of the graph. Each column 702 comprises one or more horizontally consecutive stages.

In some examples, the particular number of stages 207 in each column 702 is selected depending on the kernal block size N, as well as the parameter $s_e$, which in some examples is fixed at design time. Here, $s_e$ specifies the maximum number of stages 207 that may be accommodated in each column 702, which can adopt any value in the range '1' to $n_{max} = \log 2(N_{max})$.

In this particular example, the graph is decomposed into C=$\lceil n/s_e \rceil$ number of columns, where n=$\log_2(N)$ is the number of stages in the graph. More specifically, the first C−1 columns each comprise $s_e$ stages 207, while the right-most column comprises $s_{C-1} = n - (C-1)s_e$ stages, where $s_{C-1}$ may adopt any value in the range '1' to $s_e$, depending on the kernal block size N. This is exemplified in FIG. 5, where s=[2; 2; 1] results from $s_e=2$ in the example where the graph comprises n=5 stages 207.

In some alternative examples, the n stages 207 may be distributed among the C columns 702 using any other combination that satisfies $s_c \leq s_e$ for all $c \in [0, C-1]$. In some examples the graph may be decomposed into a maximum of $C_{max} = \lceil n_{max}/s_e \rceil$ number of columns, where the right-most column comprises a maximum of $s_{C-1,max} = n_{max} - (C_{max}-1)s_e$ stages 207 and all other columns comprise a maximum of $s_{c,max} = s_e$ stages 207. The set of columns is associated with a vector of so-called sub-code radixes r=$[r_c]_{c=0}^{C-1}$, where each sub-code radix is given by:

$$r_c = 2^{\Sigma_{c'=0}^c s_{c'}}.$$

Here, the sub-code radix $r_c$ of a particular column 702 quantifies the kernal block size N that would result if the graph comprised only the stages 207 in that column and in the columns to its left. Note that the sub-code radix $r_c$ of each successive column 702 grows from left to right. Each column 702 is decomposed into R=max(N/$n_e$, 1) independent sub-graphs 701, each having N/R=min(N,$n_e$) horizontally-aligned connections on its left- and right-hand edges, but no connections to any other sub-graphs within the column. Here, $n_e$ specifies the maximum sub-graph block size, which is a parameter that is fixed at design time and which can adopt the value of any power of two in the range $2^{s_e}$ to $N_{max}$. The connections on the left- and right-hand edges of a sub-graph 701 in the left-most column are vertically consecutive to each other. This is exemplified in the left-most column of FIG. 5, where R=4 results from $n_e=8$ in the example where the graph comprises n=5 stages 207. As exemplified by the middle column of FIG. 5, columns 702 having an index $c \in [1, C-1]$ are comprised of sub-graphs 701 with connections on the left- and right-hand edges that are vertically offset from each other by $r_{c-1}$ positions, unless $r_{c-1} > R$. When $r_{c-1} > R$, the sub-graph comprises N\$r_{c-1}$ groups of $r_{c-1}/R$ vertically consecutive connections, where the groups are vertically offset from each other by $r_{c-1}$ positions, as exemplified in the right-most column of FIG. 5. In some examples, the vertical offset is used to select which XORs and interconnections form each sub-graph.

Figure 6:
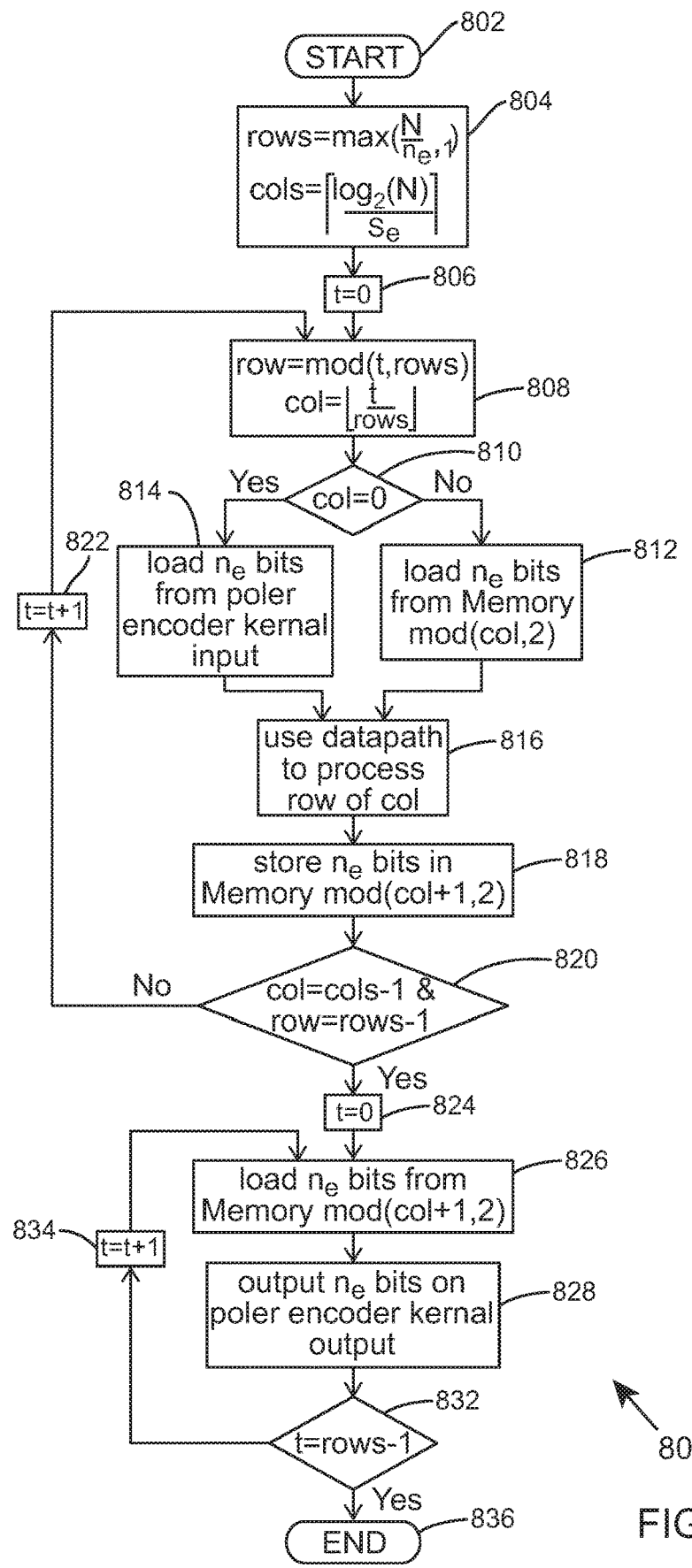
FIG. 6 illustrates an example flow chart of the encoding process employed by the proposed polar encoder kernal whereby each cycle around the main loops of the flow chart corresponds to one step of the data encoding process, according to example embodiments of the invention.

Referring now to FIG. 6 a flow chart 800 of the encoding process employed by the proposed polar encoder kernal 102, 600 is illustrated according to examples of the invention. The flowchart 800 starts at 802 and, at 804, the number of sub-graphs in each column is set to R=max(N/$n_e$; 1) and the number of columns has been set to C=ceil($\log_2(N)/s_e$). At 806 the main encoding loop is initiated, with a counter t set to '0'.

At 808, the current column is identified using the index to col=floor(t/R) and the sub-graph to be processed within the current column is identified using the index row=mod(t, R). At 810, a determination is made as to whether the column being processed is =0. If at 810, the column being processed is not=0, then the flowchart moves to 812 whereby $n_e$ bits are loaded from the memory block 602, 603 having the index mod(col, 2). However, if at 810, the column being processed is =0, then the flowchart moves to 814 whereby $n_e$ bits are loaded from the polar encoder kernel input. After 812 or 814, the flowchart moves to 816 whereby the datapath 601 is used to process the current sub-graph of the selected column. At 818, $n_e$ bits are then stored in the memory block 602, 603 having the index mod(col+1, 2). Note that the input to the datapath 601 is read from one of the two memory blocks 602, 603 and the output of the datapath 601 is written to the other of the two memory blocks 602, 603. Here, the roles of the two memory blocks alternate during the processing of successive columns, such that the memory block that is written to during the processing of one column is read from during the processing of the next column. At 820, a determination is then made as to whether col=C−1 and the row=R−1. If the col=C−1 or the row=R−1 is not valid, then the counter is incremented (t=t+1) at 822. Thereafter, the flowchart loops to 808. If the determination of col=C−1 and the row=R−1 is valid, then the counter is reset at 824, with t=0. At 826, the $n_e$ bits are loaded from memory block having the index mod(col+1, 2) and at 828 the encoder outputs $n_e$ bits on the polar encoder kernal output 606. At 832, a determination is made as to whether the counter t has reached R−1. If the counter of t has not reached the R−1 at 832, then the counter is incremented at 834. If the counter t has reached R−1 at 832, then the flowchart ends at 836 and the conversion of the kernal information block into the kernal encoded block is complete.

Thus, in accordance with the data dependencies described previously, the proposed polar encoder kernal 102, 600 completes the processing for each column (e.g. one of the columns in FIG. 5) one after another, from left to right. Within each column, the sub-graphs 701 are processed one after another, in order from top to bottom, where the processing of each sub-graph constitutes one step in the proposed polar encoding process, as shown in FIG. 6. In alternative examples, the sub-graphs 701 within each column 702 may be processed in any order, whereby such alternative examples may require modifications to the design described above.

This approach is in contrast to the prior art of [7], [8], which decomposes the polar code graph into only a single column, comprising several rows, which are processed one after another, and specifically in order from top to bottom. While the present invention requires a greater number of steps to complete the polar encoder kernal operation, the amount of datapath hardware required and the critical path length depends only on the maximum number of stages in a column, rather than on the maximum number of stages $n_{max} = \log_2(N_{max})$ in the polar code graph, as in the prior art. This ensures that a high utility of the hardware is maintained for all block sizes, achieving superior hardware efficiency to the prior art. More specifically, the proposed approach exploits all of its parallelism in almost every step of the encoding process, irrespective of the number of stages 207 in the graph, resulting in maximised hardware efficiency for all block lengths.

Figure 7:
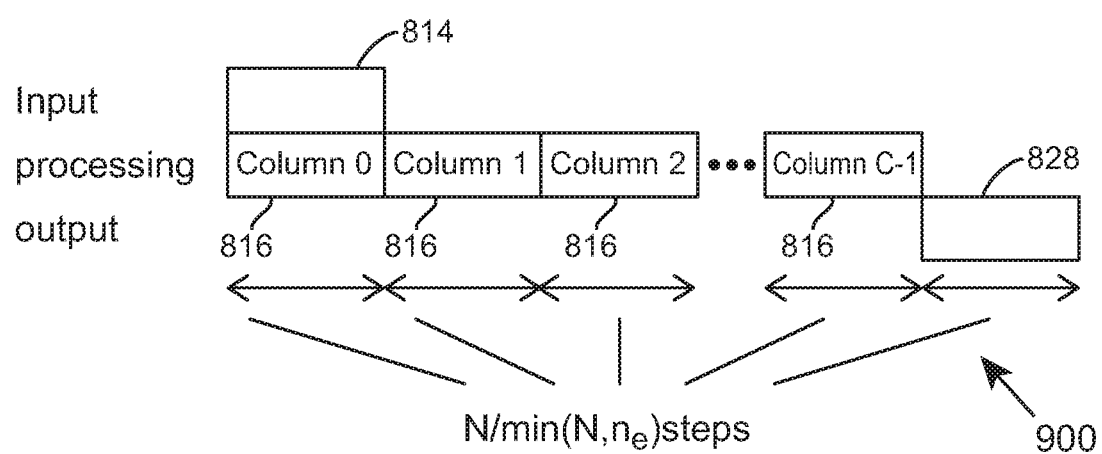
FIG. 7 illustrates an example timing diagram for the proposed polar encoder kernal, according to example embodiments of the invention.

Referring now to FIG. 7, an example timing diagram for the proposed polar encoder kernal 102, is illustrated according to example embodiments of the invention.

As shown in FIG. 7, the whole process comprises a total of $T=\Sigma_{c=0}^{C-1} N/n_c = \lceil \log_2(\max(N,n_e))/s_e \rceil N/\min(N,n_e)$ steps. Note that the kernal information block 105 can be loaded into the proposed polar encoder kernal 102 concurrently with the processing of the left-most column in the graph. However, a further $N/\min(N,n_e)$ steps are required to output the kernal encoded block 106. In an alternative example (not shown), the outputting of one or more bits from of the kernal encoded block 106 may begin towards the end of the processing of the right-most column, thereby allowing some concurrency to be achieved. Each step may correspond to a single clock cycle in a hardware implementation, depending on if, and how, pipelining is applied, which may be used to optimise the clock frequency of the polar encoder kernal.

Encoder Datapath Example:

The datapath 601 of the proposed polar encoder is designed to perform the processing associated with one sub-graph of the polar code graph in each step of the polar encoding process. In this manner, the kernal information bits input on the left-hand edge of the polar code graph may be successively combined by the datapath into intermediate bits during successive steps of the polar encoding process, until the kernal encoded bits that are output on the right-hand edge of the polar code graph are obtained.

The datapath 601 of the proposed polar encoder is parameterised by $s_e$ and $n_e$, which are referred to here as the number of datapath stages and the datapath block size, the number of datapath stages $s_e$ can adopt any value in the range '1' to $n_{max}$, while the datapath block size $n_e$ can adopt the value of any power of two in the range $2^{s_e}$ to $N_{max}$. As exemplified in FIG. 8, the datapath 601 resembles a vertical concatenation of $n_e/2^{s_e}$ graph representations of the generator matrix $F^{\otimes s_e}$, which also resembles the left-most $s_e$ stages 207 in a graph representation of the generator matrix $F^{\otimes \log_2(n_e)}$. In this manner, having a larger $n_e$ is similar to a processing of more than one sub-graph at a time.

In alternative example arrangements (not shown), the datapath 601 may resemble any ordering of $s_e$ different stages 207 from a graphical representation of the generator matrix $F^{\otimes \log_2(n_e)}$ albeit with different RAM and controller designs to those described above.

Figure 8:
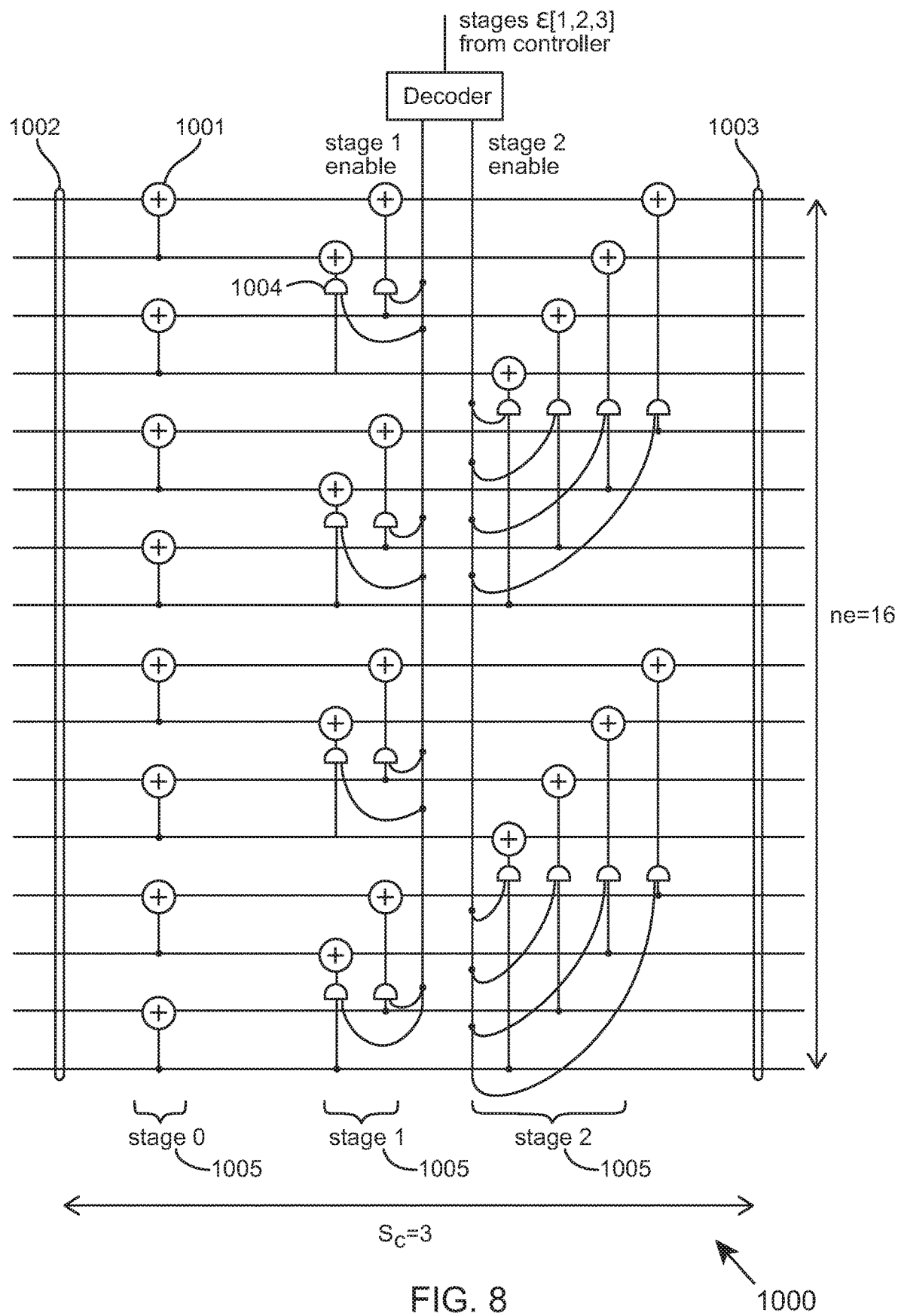
FIG. 8 illustrates an example schematic of the datapath in the proposed polar encoder kernal, for the example of $s_e=3$ and $n_e=16$, according to example embodiments of the invention.

Referring now to FIG. 8 an example schematic of the datapath 601 in the proposed polar encoder kernal 102, is illustrated for the example of $s_e=3$ and $n_e=16$. As exemplified in FIG. 8, the datapath 601 comprises a total of $s_e n_e/2$ XOR gates 1001, which propagate bits from the left edge 1002 of the datapath to its right edge 1003, along paths having a critical length comprising $s_e$ XOR gates. The operation of the datapath 601 is also dictated by the number of stages $s_c$ in the current column 702, which may be lower than $s_e$ in the example of the right-most column, as illustrated in Figure FIG. 5 and described in the accompanying discussion. When $s_c < s_e$, the number of stages in the datapath is reduced to match $s_c$ by disabling the XOR gates 1001 in the right-most stages of the datapath. In some examples, this disabling operation may be achieved by using AND gates 1004, as shown, to mask the corresponding vertical connections in the datapath. More specifically, a vertical connection may be enabled by providing a one-valued control input to the corresponding AND gate, allowing the bit value carried by the vertical connection to pass. By contrast, a vertical connection may be disabled by providing a zero-valued control input to the corresponding AND gate, forcing the vertical connection to provide a zero-valued bit to the corresponding XOR gate. In turn, this forces the XOR gate to pass the bit value provided on its left-hand input straight through to its output, effectively disabling the XOR gate.

In alternative example arrangements, stages 1005 (other than the right-most stages) may be disabled, in order to reduce the number of stages from $s_e$ to $s_c$. However, these alternative example arrangements may require a different controller design to that described above, as appreciated by a skilled artisan.

In some alternative example arrangements, it is envisaged that a designer may insert pipelining registers between some or all of the stages 1005 in the XOR graph, which may require a modification to the design of the controller. Here, pipelining may be introduced to increase the clock frequency of the polar encoder kernal, at the cost of increasing the number of clock cycles required. By carefully selecting if and how to apply pipelining, the throughput and latency of the polar decoder kernal can be optimised, such that the advantage of increased clock frequency maximally outweighs the disadvantage of requiring more clock cycles.

Encoder Memory Example:

Referring back to FIG. 4, the proposed polar encoder kernal 102 employs two three-dimensional blocks of memory, namely Memory '0' 602 and Memory '1' 603. Each of these memory blocks comprises $2^{s_e}$ RAMs, having widths of $n_e$ bits and depths of $\max(N_{max}/(2^{s_e} n_e), 1)$ addresses, where the RAMs, their width and their depth represent the three dimensions of the memory block. The total memory requirement of the proposed polar encoder kernal 102 is given by $2 \max(N_{max}, 2^{s_e} n_e)$ bits.

In some alternative example arrangements, it is envisaged that a designer may swap the roles of the RAM and width dimensions, instead for example by employing $n_e$ RAMs, having widths of $2^{s_e}$ bits. Also, rather than accommodating the two memory blocks 602, 603 in the RAM dimension using two distinct groups of RAMs, in some example alternative arrangements it is envisaged that a designer may accommodate the two blocks of memory within a single group of RAMs, either by doubling their widths or by doubling their depths, therefore accommodating the two memory blocks in the width or depth dimensions instead. However, these alternative example arrangements may require different datapath interfaces and a different controller design to that described above, as appreciated by a skilled artisan.

Figure 9:
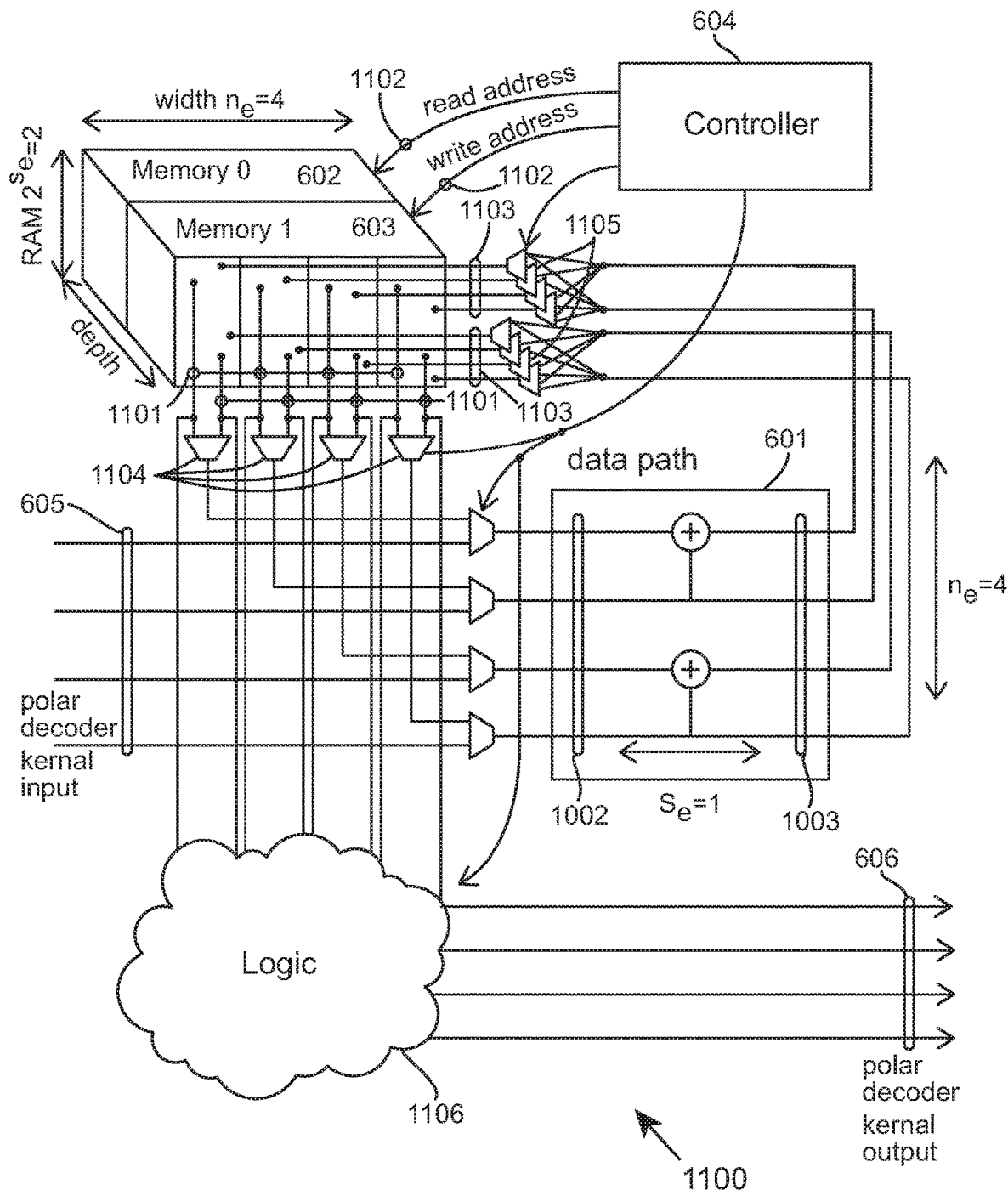
FIG. 9 illustrates an example schematic of the interaction between the datapath, memory and controller of the proposed polar encoder kernal, for the example of $s_e=1$ and $n_e=4$, according to example embodiments of the invention.

Referring now to FIG. 9 an example schematic of the interaction between the datapath 601, memory 602, 603 and controller 604 of the proposed polar encoder kernal 102, for the example of $s_e=1$ and $n_e=4$, is illustrated according to example embodiments of the invention. As illustrated, each RAM in each block of memory has an $n_e$-bit read port 1101. This read port outputs the $n_e$ bits across the width of a particular one of the $\max(N_{max}/(2^{s_e} n_e), 1)$ addresses across the depth of the RAM. Here, the particular address is selected by an input provided on an address port 1102, as shown in FIG. 9. Likewise, each RAM has a $n_e$-bit write port 1103, as shown in FIG. 9. This write port accepts inputs that can update the $n_e$ bits across the width of a particular address, which is selected by the input provided on the address port 1102. However, these $n_e$ bits are only updated if corresponding write enable signals 607 are asserted. It is assumed that $n_e$ individual write enable signals can be used to control whether each of the $n_e$ bits is written individually. If this is not supported natively by a particular hardware RAM implementation, then the write port 1103 can be driven by $n_e$ multiplexers 608, which can be used to multiplex the input bits with feedback from the read port 1101. In this way, the $n_e$ write enable signals can individually control the bits selected by these $n_e$ multiplexers, either writing the new bit value to the RAM, or maintaining the current bit value by writing the corresponding bit obtained from the read port 1101. For the sake of simplicity, this mechanism is not depicted in FIG. 9, although it is shown in FIG. 4.

During the processing of each successive column 702 in the graph from left to right, the roles of the two memory blocks 602, 603 alternate. More specifically, for columns having even indices $c \in \{0, 2, 4, \ldots\}$, bits are read from Memory '0' 602 (or directly from the $n_e$-bit input 605 to the proposed polar encoder kernal 102 in the example of column '0'), provided to the datapath 601 and the resultant bits are written to Memory '1' 603. By contrast, bits are read from Memory '1' 603, provided to the datapath 601 and the resultant bits are written to Memory '0' 602 in the example of columns having odd indices $c \in \{1, 3, 5, \ldots\}$. In this way, the memory block that was written to during the processing of a particular column 702 is read from during the processing of the next column. This alternated operation of the two memory blocks 602, 603 may be achieved by multiplexing 609 the read data ports of the RAMs in Memory '0' 602 with those of the corresponding RAMs in Memory '1' 603. Likewise, the write enable signals 608 of the RAMs in Memory '0' may be shared with those of the corresponding RAMs in Memory '1', but masked alternately. For the sake of simplicity, these mechanisms are not depicted in FIG. 9, although they are shown in FIG. 4.

The interfaces between the memory blocks 602, 603 and the datapath 601 are designed specifically to avoid the requirement for complicated routing networks, which would be required to allow any bit in the memory blocks 602, 603 to be read or written by any of the inputs or outputs of the datapath 601. Instead, the arrangement of the bits in the memory block is designed such that only simple routing networks are required between the memory blocks 602, 603 and the datapath 601. Likewise, it is designed so that only a limited number of control signals are required from the controller 604.

This is achieved by carefully arranging the bits within the three dimensions of the memory blocks 602, 603 in a manner that is sympathetic to the specific data dependencies of a polar encoder kernal. This is necessary because owing to the different arrangement of XORs in each column, consecutive columns in the polar code graph must be decomposed into sub-graphs having different arrangements, as exemplified in FIG. 5. As a result, the bits that the datapath 601 writes at the same time during the processing of the sub-graphs in one column will not be read by the datapath 601 at the same time when processing the sub-graphs in the next column. However, irrespective of this, the proposed arrangement of bits in the memory block allows the datapath 601 to seamlessly read the input bits that it requires at the same time, as well as to seamlessly write the output bits that it generates at the same time.

More specifically, the address ports of the $2^{s_e}$ RAMs within a particular memory block 602, 603 are all tied together, only requiring the controller 604 to generate a single address for each of the memory blocks 602, 603. Furthermore, the bit input 1002 on the left-hand edge of the datapath 601 reads from the memory blocks 602, 603 on a simple width-wise basis, as detailed below. By contrast, the bit output 1003 on the right-hand edge of the datapath 601 writes to the memory blocks 602, 603 on a simple RAM-wise basis, as detailed below. In an alternative example arrangement, the width-wise bit memory accesses may be replaced with RAM-wise accesses and vice-versa, although this would imply different datapath interfaces and controller designs to those described below.

For both width-wise and RAM-wise interfaces between a memory block 602, 603 and the datapath 601, the bit having the position $l \in [0, n_e-1]$ in the input 1002 or output 1003 of the datapath 601 is read from or written to a particular position within the width of a particular address within the depth of a particular one of the RAMs in the memory block. This location in the memory block 602, 603 may be identified by the width coordinate $w_l \in [0, n_e-1]$ the depth coordinate $d_l \in [0, \max(N_{max}/(2^{s_e}n_e),1)-1]$ and the RAM coordinate $r_l \in [0, 2^{s_e}-1]$. As mentioned above, the arrangement of the bits in each memory block 602, 603 and the operation of the proposed polar encoder kernal 102 is such that the address ports of the $2^{s_e}$ RAMs within a particular bit memory block 602, 603 can all be tied together. This implies that for both width-wise and RAM-wise interfaces, all $n_e$ of the bits that are accessed together will all have the same depth coordinate, which is to say that $d_l$ has the same value for all $l \in [0, n_e-1]$. Furthermore, the bit in the width-wise datapath input 1002 having the position $l \in [0, n_e-1]$ only ever reads from locations in the memory block 602, 603 having the corresponding width coordinate $w_l = l$. However, this bit in the datapath interface may need to read from any of the possible RAM coordinates $r_l \in [0, 2^{s_e}-1]$ at different times during the polar encoding process. Owing to this, a $2^{s_e}:1$ multiplexer 1104 is the only circuitry required to provide the $l^{th}$ bit to the width-wise datapath input 1002. More specifically, this multiplexer 1104 selects between the bits provided by the $l^{th}$ position in the read ports 1101 of each of the $2^{s_e}$ RAMs, as shown in FIG. 9. Here, the controller 604 is required to provide $n_e$ RAM read coordinates to the memory block, which may be decoded in order to provide separate control signals to each of these $n_e$ multiplexers 1104.

Furthermore, the bit having the position $l \in [0, n_e-1]$ in the RAM-wise output 1003 of the datapath is only ever written to locations in the memory block 602, 603 having the corresponding RAM coordinate $r_l = \mod(l, 2^{s_e})$. However, this bit may need to be written to any of the possible width coordinates $w_l \in [0, n_e-1]$ at different times during the polar encoding process. Owing to this, a $n_e/2^{s_e}:1$ inputs to each multiplexer 1105 is the only circuitry required to provide each of the $n_e$ inputs to each of the RAMs' $2^{s_e}$ write ports 1103, as shown in FIG. 9. This is because each input of the RAM having the RAM coordinate $r_l$ is only selected from the sub-set of datapath output bits 1003 having positions $l \in [0, n_e 1]$ that satisfy $\mod(l, 2^{s_e}) = r_l$. Here, the controller 604 is required to provide $n_e$ width write coordinates to the memory block 602, 603, which may be decoded to assert $n_e$ of the write enable signals 607, as well as to provide control signals for the corresponding sub-set of $n_e$ multiplexers 1105.

Following the completion of the decoding process, the memory block 602, 603 that was written to most recently is read over a series of steps by the bit output 606 of the proposed polar encoder kernal 102, which has a width of $n_e$ bits. However, these read operations are not performed width-wise in the general case, where the number of stages in the graph $n = \log 2(N)$ is not divisible by the number of stages in the datapath $s_e$. For this reason, in some examples, a permutation network 1106 is provided to interface the memory blocks 602, 603 with the bit output 606 of the proposed polar encoder kernal 102, as shown in FIG. 9.

Encoder Controller Example:

As described above in FIG. 7, the proposed polar encoding process comprises a total of:

$T=\Sigma_{c=0}^{C-1} N/n_c = \lceil \log_2(\max(N,n_e))/s_e \rceil N/\min(N,n_e)$ steps. Here, the processing of the sub-graphs 701 within each successive column 702 are completed, before advancing to the next column in order, from left to right. The controller 604 of FIG. 4 includes a counter t, which adopts the logic value '0' at the start of the encoding process and increments towards T−1 in each successive step. As described above, each step of the proposed polar encoding process involves reading $n_e$ bits from one memory block 602, 603 or from the bit input 605 to the proposed polar encoder kernal 102, processing them in the datapath 601 and then writing the resultant $n_e$ bits to the other memory block, where the roles of the two memory blocks 602, 603 alternate in successive columns 702. The controller 604 is designed such that regardless of which column 702 in the graph is being processed, each memory read operation seamlessly provides a set of $n_e$ bits that may be combined by the datapath 601, in order to complete a set of XOR operations according to the connections in the graph. Furthermore, the controller 604 is designed such that each memory write operation seamlessly arranges the resulting set of $n_e$ bits in the memory blocks 602, 603, so that they can be seamlessly read in the fashion described above when the processing advances to the next column 702. During the first $N/\min(N,n_e)$ steps of the encoding process, the processing is performed concurrently with the loading of the kernal information block $u=[u_j]_{j=0}^{N-1}$ 105 from the input 605 to the polar encoder kernal 102, which has a width of $n_e$ bits. In the example where $N<n_e$, zero-valued bits are appended to the end of the kernal information block 105 before it is provided to the proposed polar encoder kernal 102, in order to increase its length to $n_e$. Following this, the bit input of the proposed polar encoder kernal 102 provides $n_e$ bits in each step, in order of increasing bit index j. More specifically, during the step in the loading process having the index $t \in [0, N/\min(N,n_e)-1]$, the bit provided to the position $l \in [0, n_e-1]$ in the input to the proposed polar encoder kernal 102 is $u_{tn_e+l}$. During the first $N/\min(N, n_e)$ steps of the encoding process, these bits are provided directly to the corresponding bit inputs 1002 of the datapath 601, as shown in FIG. 4. After the first $N/\min(N, n_e)$ steps in the encoding process, the input 1002 to the datapath 601 is loaded from one or other of the memory blocks 602, 603. During the step in the encoding process having the index $t \in [N/\min(N, n_e), \lceil \log_2(\max(N, n_e))/s_e \rceil N/\min(N, n_e)-1]$, the bit that is provided to the position $l \in [0, n_e-1]$ in the input 1002 to the datapath 601 is read from the depth $d_l$, RAM $r_l$ and width $w_l$ coordinates of the corresponding memory block, according to:

$$d_l = \mathrm{mod}\left(t, \max\left(\frac{N}{2^{s_e} n_e}, 1\right)\right),$$

$$r_l = \mathrm{mod}\left(\left\lfloor \frac{l 2^{s_e} + t n_e 2^{s_e}}{\max(N, n_e)} \right\rfloor, 2^{s_e}\right),$$

$$w_l = l.$$

Here, it may be observed that the width coordinates $w_l = l$ that the datapath input bits 1002 are read from are independent of the step index t and may therefore be hardwired according to the width-wise operation. By contrast, the depth $d_l$ and RAM $r_l$ coordinates must be controlled by the controller 604, as a function of the step index t. Note that the depth coordinates dl are independent of the bit index l, only requiring the controller 604 to provide a single read address, which is shared by all RAMs in the memory block 602, 603. However, the RAM coordinates $r_l$ are dependent on the bit index l, requiring the controller 604 to generate a separate control signal for each of the $n_e$ bits.

During the step in the polar encoding process having the index:

$t \in [0, \lceil \log_2(\max(N,n_e))/s_e \rceil N/\min(N,n_e)-1]$, the bit that is provided by the position $l \in [0, n_e-1]$ in the output 1003 of the datapath 601 is written to the depth $d_l$ and RAM $r_l$ and width $w_l$ coordinates of the corresponding memory block 602, 603, according to:

$$d_l = \mathrm{mod}\left(\left\lfloor \frac{t}{2^{s_e}} \right\rfloor, \max\left(\frac{N}{2^{s_e} n_e}, 1\right)\right),$$

$$r_l = \mathrm{mod}(l, 2^{s_e}),$$

$$w_l = \mathrm{mod}\left(\frac{l \max(N, n_e)}{2^{s_e}} + \mathrm{mod}\left(\left\lfloor \frac{l + t n_e}{2^{s_e}} \right\rfloor, \frac{\max(N, n_e)}{2^{s_e}}\right), n_e\right).$$

Here, it may be observed that the RAM coordinates $r_l = \mathrm{mod}(l, 2^{s_e})$ that the datapath output bits 1003 are written to are independent of the step index t and may therefore be hardwired according to the RAM-wise operation. By contrast, the depth $d_l$ and width $w_l$ coordinates must be controlled by the controller 604, as a function of the step index t. Note that the depth coordinates di are independent of the bit index l, only requiring the controller 604 to provide a single write address, which is shared by all RAMs in the memory block 602, 603. However, the width coordinates $w_l$ are dependent on the bit index l, requiring the controller 604 to generate a separate control signal for each of the $n_e$ bits. As shown in FIG. 7, a further $N/\min(N,n_e)$ steps are used following the completion of the polar encoding process, in order to read encoded bits from the appropriate memory block 602, 603 and provide them to the output 606 of the polar encoder kernal 102, which has a width of $n_e$ bits. Collectively, these bits form the kernal encoded block $x=[x_j]_{j=0}^{N-1}$ 106, where zero-valued bits may be removed from the end of the output 606 of the polar encoder kernal 102 in the example where $N<n_e$. The counter t is reset to a logic '0' value at the start of the outputting process and is incremented towards $N/\min(N,n_e)-1$ in each successive step.

During the $t^{th}$ step in the outputting process, the bit that is provided to the position $l \in [0, n_e-1]$ in the output 606 of the proposed polar encoder kernal 102 is read from the depth $d_l$, RAM $r_l$ and width $w_l$ coordinates of the corresponding memory block 602, 603, according to:

$$d_l = \mathrm{mod}\left(\left\lfloor \frac{t}{\alpha} \right\rfloor, \max\left(\frac{N}{2^{s_e} n_e}, 1\right)\right),$$

$$r_l = \mathrm{mod}\left(\left\lfloor \frac{l 2^{s_e} \max(N, n_e) + l 2^{s_e} + t n_e 2^{s_e}}{\max(N, n_e)\alpha} \right\rfloor, 2^{s_e}\right),$$

$$w_l = \mathrm{mod}\left(\frac{l \max(N, n_e)}{\alpha} + \left\lfloor \frac{l + t n_e}{\alpha} \right\rfloor, n_e\right),$$

where $\alpha = 2^{\mathrm{mod}(-\log_2(\max(N,n_e)), s_e)}$. Here, it may be observed that the depth $d_l$, RAM $r_l$ and width $w_l$ coordinates must be controlled by the controller 604, as a function of the step index t. Note that the depth coordinates di are independent of the bit index l, only requiring the controller 604 to provide a single write address, which is shared by all RAMs in the memory block 602, 603. However, the RAM n and width $w_l$ coordinates are dependent on the bit index l, requiring the controller 604 to generate separate control signals for each of the $n_e$ bits.

The above-described method of controlling both memory read and memory write operations results in a characteristic arrangement of bits within the memory blocks 602, 603. FIGS. 10 to 13 provide various examples of this characteristic arrangement, before and after the processing of each column 702 in the polar code graph. Each FIG. illustrates the index j∈[0, N−1] of the connection between two adjacent columns 702 in the polar graph that provides the bit stored at each RAM, depth and width coordinate in the memory block 602, 603.

Figure 10:
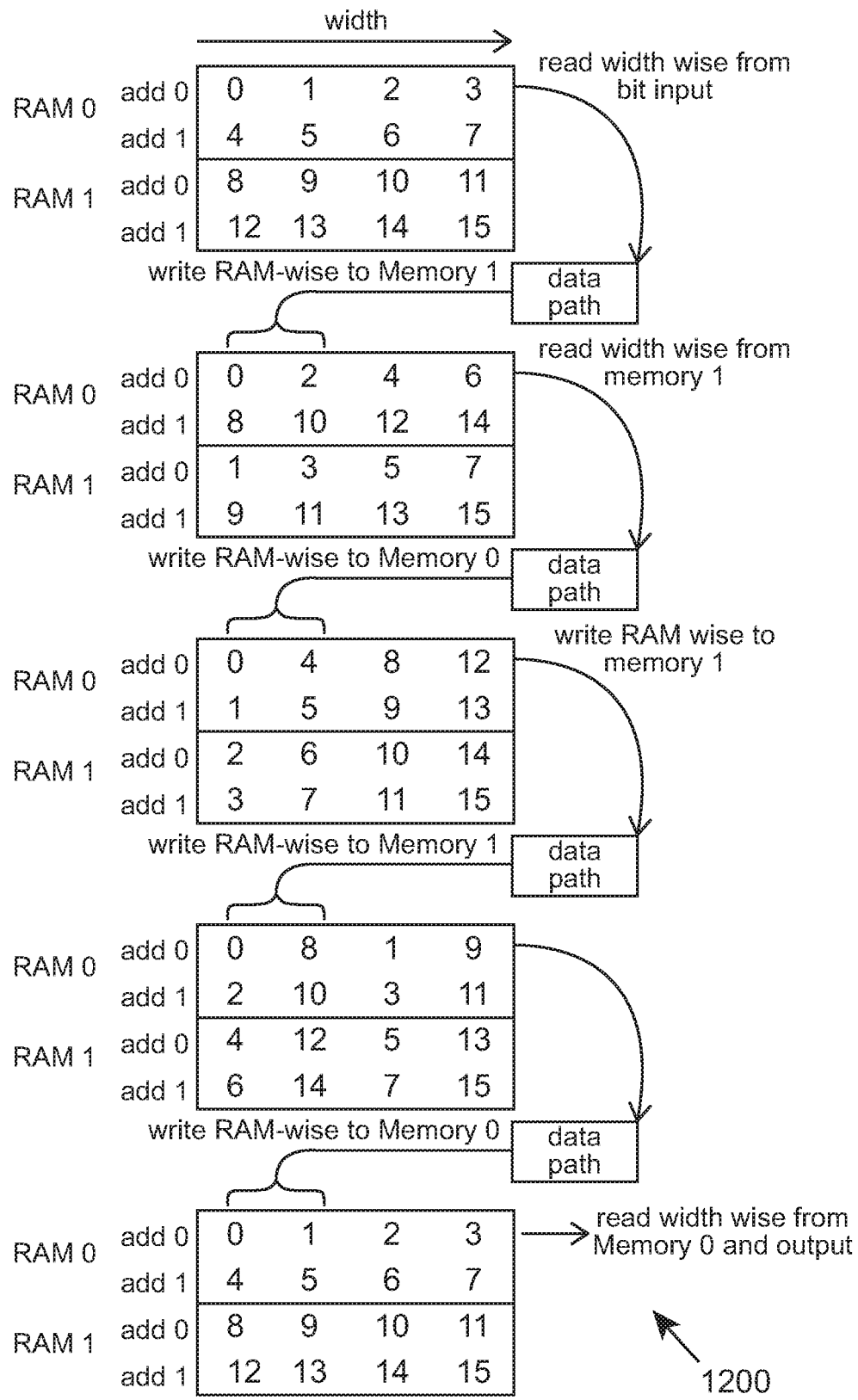
FIG. 10 illustrates an example mapping of bit indices to positions in the memory blocks in the case where N=16, $s_e=1$ and $n_e=4$, according to example embodiments of the invention.

Referring now to FIG. 10 an example mapping of bit indices to positions in the memory blocks 602, 603 using a depth comprising multiple addresses in the example where $N>2^{s_e}n_e$ and in particular where N=16, $s_e$=1 and $n_e$=4 is illustrated according to examples of the invention. Here, each memory block 602, 603 comprises $2^{s_e}$=2 RAMs, each having a depth of: max(N/($2^{s_e}n_e$),1)=2 addresses and a width of $n_e$=4 bits. A total of T=⌈$\log_2$(max(N,$n_e$))/$s_e$⌉N/min(N,$n_e$)=16 steps are required to complete the processing and a further N/min(N,$n_e$)=4 steps are required to output the encoded bits. Here, it may be seen that each read operation is performed width-wise and each write operation is performed RAM-wise, as described above. In the particular example of FIG. 10, the number of stages n=log 2 (N) in the polar code graph is divisible by the number of stages in the datapath $s_e$. Owing to this, the outputting process may read the encoded bits from the corresponding memory block 602, 603 in a width-wise manner. More specifically, it may be observed that $$w_l = \mod\left(\frac{l \max(N, n_e)}{\alpha} + \left\lfloor\frac{l + tn_e}{\alpha}\right\rfloor, n_e\right)$$

simplifies to $w_l$=l in this example.

Figure 11:
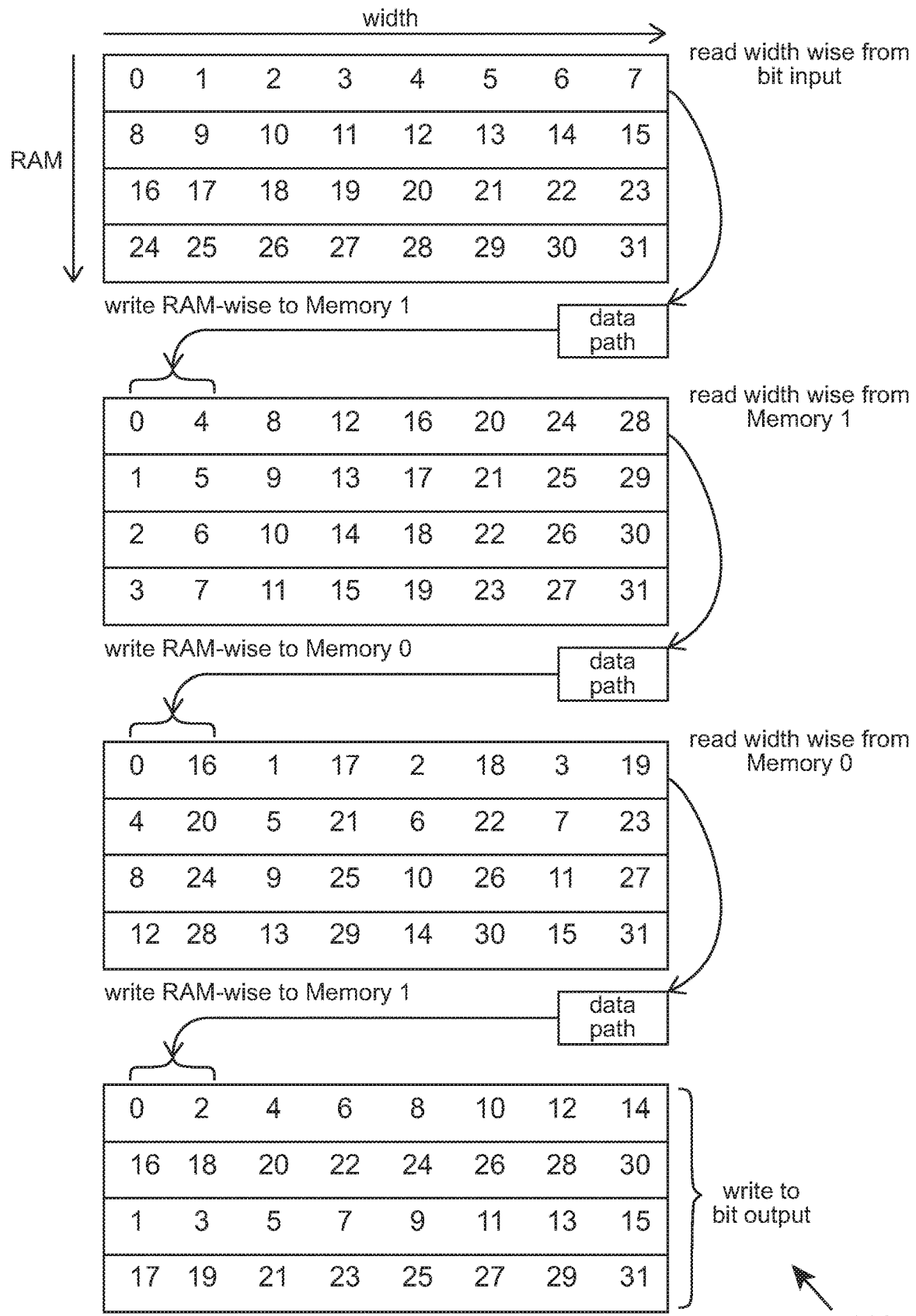
FIG. 11 illustrates an example mapping of bit indices to positions in the memory blocks in the case where N=32, $s_e=2$ and $n_e=8$, according to example embodiments of the invention.

Referring now to FIG. 11, an example mapping of bit indices to positions in the memory blocks 602, 603 in the example where N=32, $s_e$=2 and $n_e$=8 is illustrated according to examples of the invention. Here, each memory block 602, 603 comprises $2^{s_e}$=4 RAMs, each having a depth of max (N/($2^{s_e}n_e$), 1)=1 address and a width of $n_e$=8 bits. A total of T=⌈$\log_2$(max(N,$n_e$))/$s_e$⌉N/min(N,$n_e$)=12 steps are required to complete the processing and a further N/min(N,$n_e$)=4 steps are required to output the encoded bits. FIG. 11 corresponds to the example provided in FIG. 5. In this example, N=$2^{s_e}n_e$ and so each memory block 602, 603 uses a depth of only a single address. In this particular example, the width-wise reading and the RAM-wise writing of the memory block bits corresponds to reordering the indices in successive matrices of FIG. 11 from a row-first, column-second ordering to a column-first, row-second ordering. Here, it may be observed that the highlighting of the first sub-graph in each column of FIG. 5 corresponds to the first set of $n_e$ bits that are processed by the datapath 601 in each of the three columns 702, namely [0 1 2 3 4 5 6 7], [0 4 8 12 16 20 24 28] and [0 16 1 17 2 18 3 19], respectively. This illustrates how the RAM-wise writing of bits seamless enables the width-wise reading of bits to naturally provide the correct combination of bits for the next operation of the datapath 601. Note that since n is not divisible by $s_e$ in this example, the outputting process cannot be completed in a purely width-wise manner.

Figure 12:
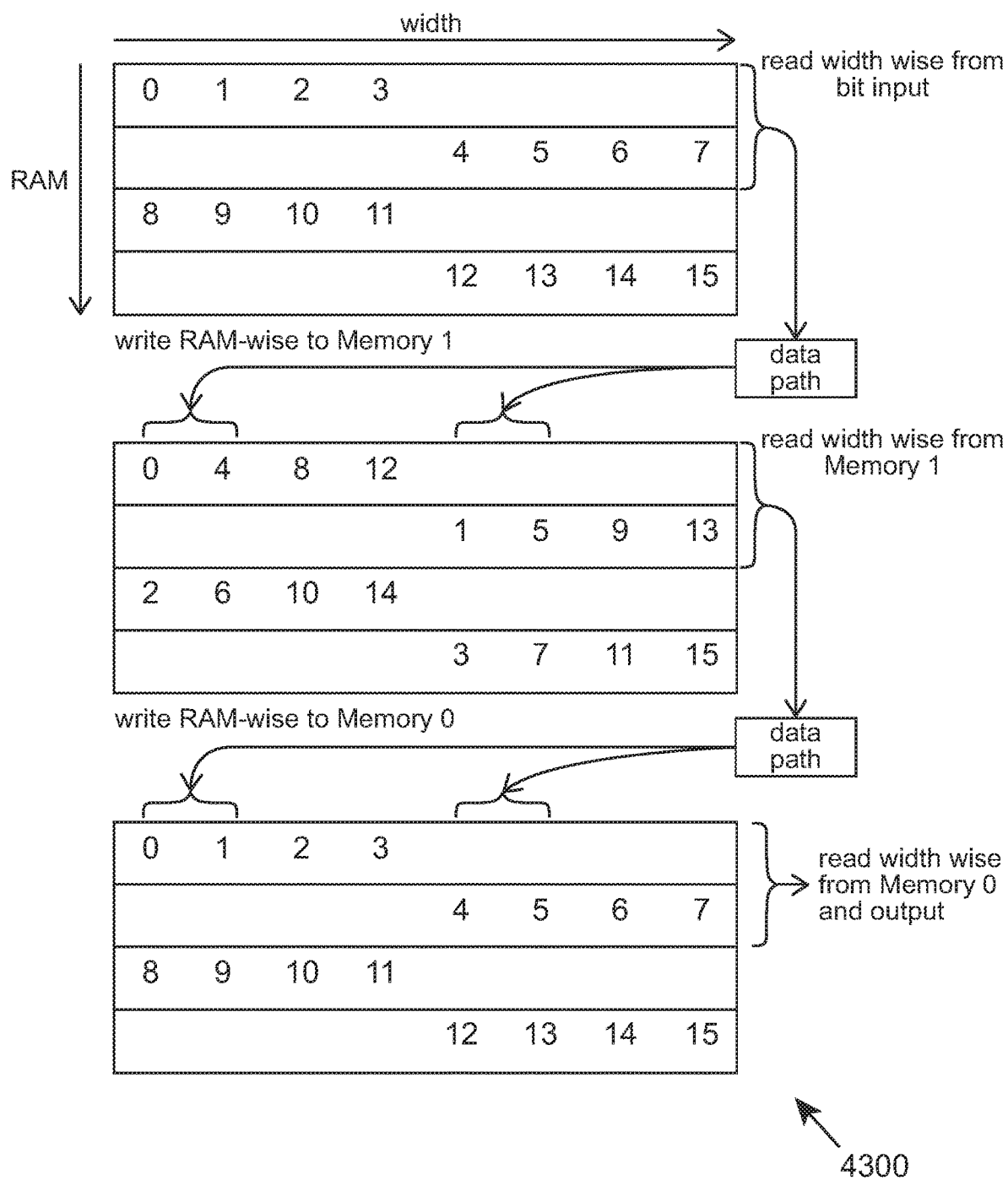
FIG. 12 illustrates an example mapping of bit indices to positions in the memory blocks in the case where N=16, $s_e=2$ and $n_e=8$, according to example embodiments of the invention.

Referring now to FIG. 12, an example mapping of bit indices to positions in the memory blocks 602, 603 in the example where $N<2^{s_e}n_e$ and in particular where N=16, $s_e$=2 and $n_e$=8 is illustrated according to examples of the invention. Here, each memory block 602, 603 requires a depth of only a single address, but the kernal block length N is not sufficient to fill the capacity of this single address in all RAMs of the memory block 602, 603. Thus, each memory block 602, 603 comprises $2^{s_e}$=4 RAMs, each having a depth of max(N/($2^{s_e}n_e$), 1)=1 address and a width of $n_e$=8 bits. A total of T=⌈$\log_2$(max(N, $n_e$))/$s_e$⌉N/min(N, $n_e$)=4 steps are required to complete the processing and a further N/min(N, $n_e$)=2 steps are required to output the encoded bits. In this example, the width-wise read and RAM-wise write operations naturally result in a diagonal arrangement of bits within the memory block 602, 603, as illustrated.

Figure 13:
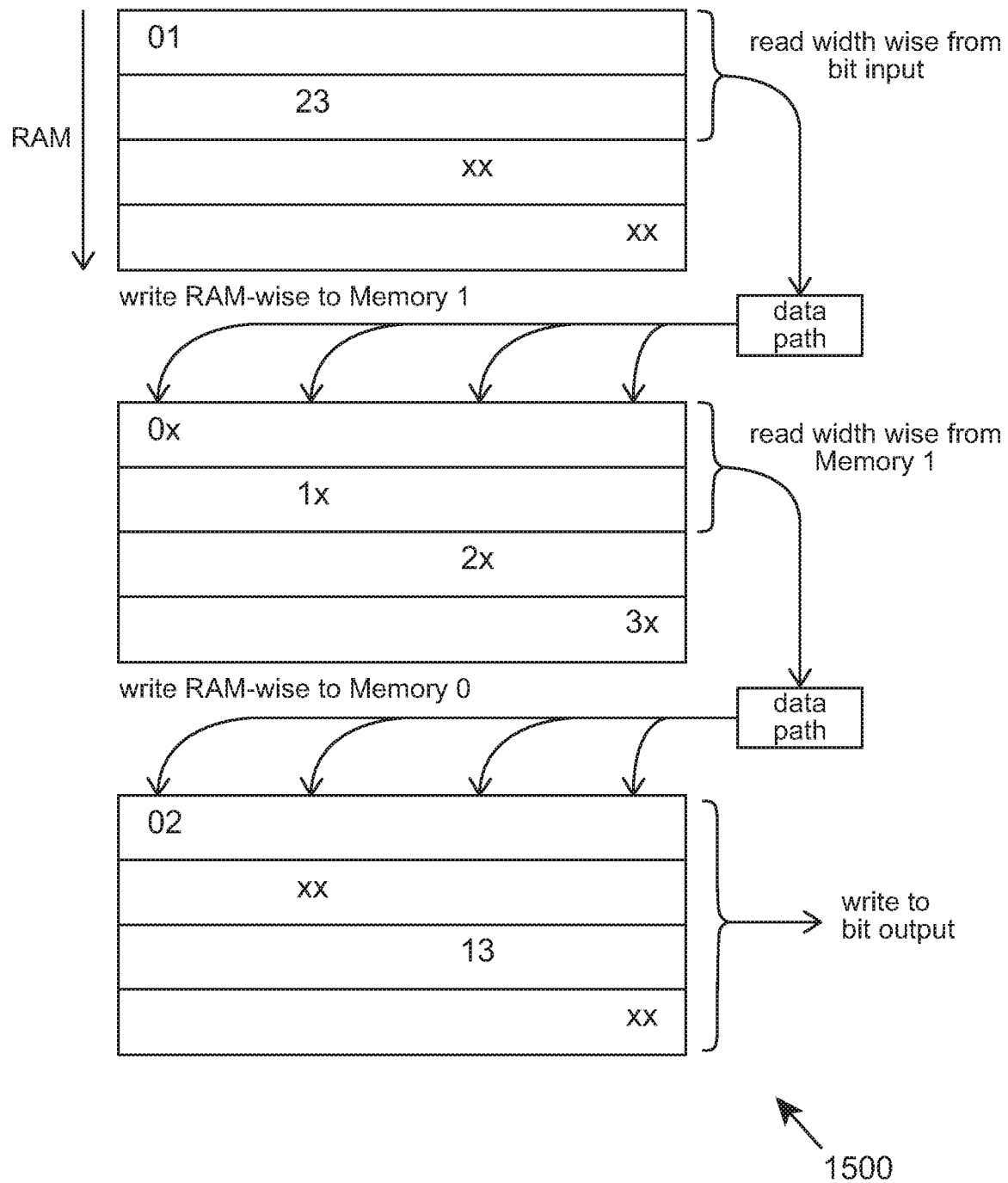
FIG. 13 illustrates an example mapping of bit indices to positions in the memory blocks in the case where N=4, $s_e$=2 and $n_e$=8, according to example embodiments of the invention.

Referring now to FIG. 13, an example mapping of bit indices to positions in the memory blocks 602, 603 in the example where N=4, $s_e$=2 and $n_e$=8 is illustrated according to examples of the invention. Here, each memory block 602, 603 comprises $2^{s_e}$=4 RAMs, each having a depth of max (N/($2^{s_e}n_e$), 1)=1 address and a width of $n_e$=8 bits. A total of T=⌈$\log_2$(max(N, $n_e$))/$s_e$⌉N/min(N, $n_e$)=2 steps are required to complete the processing and a further N/min(N, $n_e$)=1 step is required to output the encoded bits.

Figure 14:
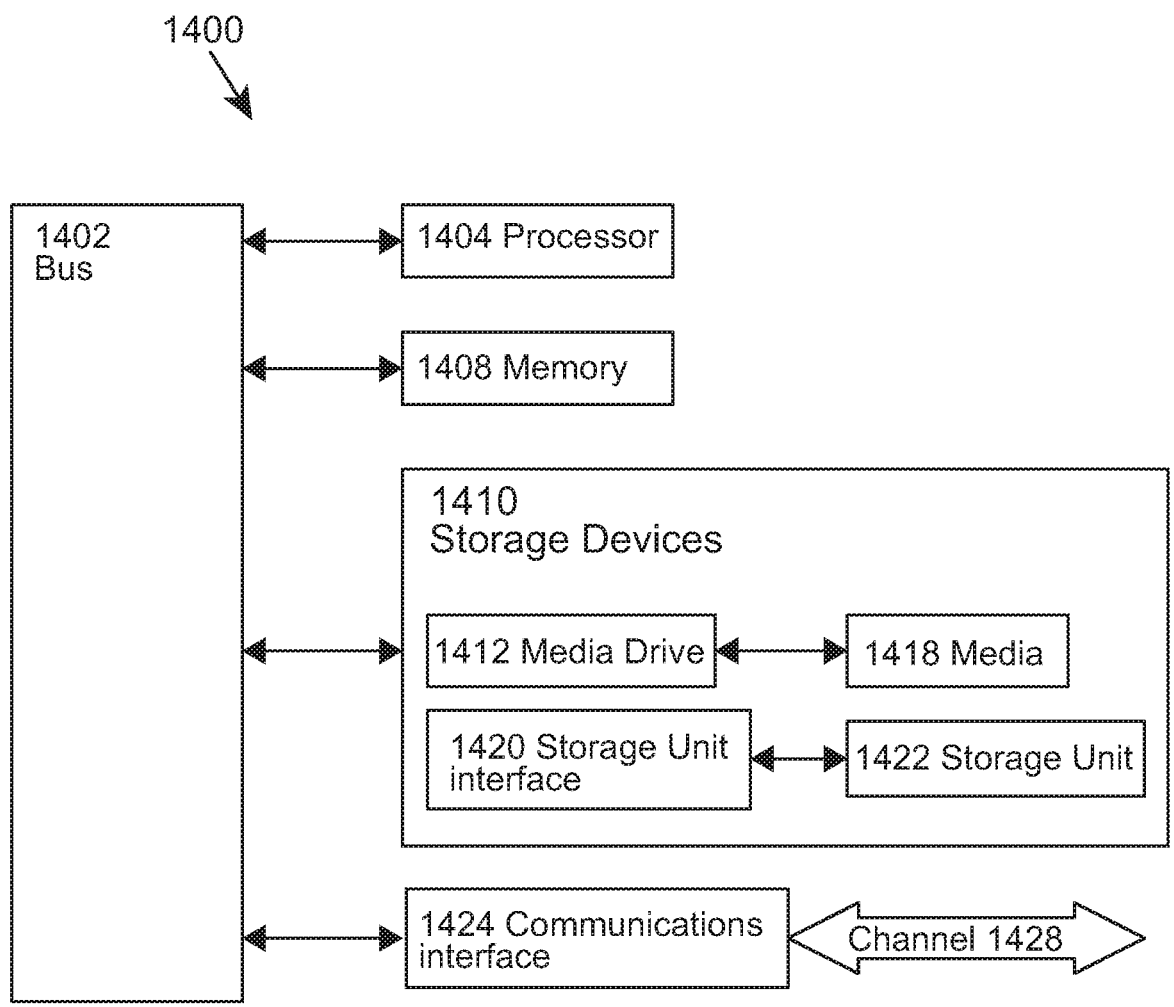
FIG. 14 illustrates a typical computing system that may be employed in an electronic device or a wireless communication unit to perform polar encoding operations in accordance with some example embodiments of the invention.

Referring now to FIG. 14, there is illustrated a typical computing system 1400 that may be employed to implement polar encoding according to some example embodiments of the invention. Computing systems of this type may be used in wireless communication units. Those skilled in the relevant art will also recognize how to implement the invention using other computer systems or architectures. Computing system 1400 may represent, for example, a desktop, laptop or notebook computer, hand-held computing device (PDA, cell phone, palmtop, etc.), mainframe, server, client, or any other type of special or general purpose computing device as may be desirable or appropriate for a given application or environment. Computing system 1400 can include one or more processors, such as a processor 1404. Processor 1404 can be implemented using a general or special-purpose processing engine such as, for example, a microprocessor, microcontroller or other control logic. In this example, processor 1404 is connected to a bus 1402 or other communications medium. In some examples, computing system 1400 may be a non-transitory tangible computer program product comprising executable code stored therein for implementing polar encoding.

Computing system 1400 can also include a main memory 1408, such as random access memory (RAM) or other dynamic memory, for storing information and instructions to be executed by processor 1404. Main memory 1408 also may be used for storing temporary variables or other intermediate information during execution of instructions to be executed by processor 1404. Computing system 1400 may likewise include a read only memory (ROM) or other static storage device coupled to bus 1402 for storing static information and instructions for processor 1404.

The computing system 1400 may also include information storage system 1410, which may include, for example, a media drive 1412 and a removable storage interface 1420. The media drive 1412 may include a drive or other mechanism to support fixed or removable storage media, such as a hard disk drive, a floppy disk drive, a magnetic tape drive, an optical disk drive, a compact disc (CD) or digital video drive (DVD) read or write drive (R or RW), or other removable or fixed media drive. Storage media 1418 may include, for example, a hard disk, floppy disk, magnetic tape, optical disk, CD or DVD, or other fixed or removable medium that is read by and written to by media drive 1412. As these examples illustrate, the storage media 1418 may include a computer-readable storage medium having particular computer software or data stored therein.

In alternative embodiments, information storage system 1410 may include other similar components for allowing computer programs or other instructions or data to be loaded into computing system 1400. Such components may include, for example, a removable storage unit 1422 and an interface 1420, such as a program cartridge and cartridge interface, a removable memory (for example, a flash memory or other removable memory module) and memory slot, and other removable storage units 1422 and interfaces 1420 that allow software and data to be transferred from the removable storage unit 1418 to computing system 1400.

Computing system 1400 can also include a communications interface 1424. Communications interface 1424 can be used to allow software and data to be transferred between computing system 1400 and external devices. Examples of communications interface 1424 can include a modem, a network interface (such as an Ethernet or other NIC card), a communications port (such as for example, a universal serial bus (USB) port), a PCMCIA slot and card, etc. Software and data transferred via communications interface 1424 are in the form of signals which can be electronic, electromagnetic, and optical or other signals capable of being received by communications interface 1424. These signals are provided to communications interface 1424 via a channel 1428. This channel 1428 may carry signals and may be implemented using a wireless medium, wire or cable, fibre optics, or other communications medium. Some examples of a channel include a phone line, a cellular phone link, an RF link, a network interface, a local or wide area network, and other communications channels.

In this document, the terms 'computer program product', 'computer-readable medium' and the like may be used generally to refer to media such as, for example, memory 1408, storage device 1418, or storage unit 1422. These and other forms of computer-readable media may store one or more instructions for use by processor 1404, to cause the processor to perform specified operations. Such instructions, generally referred to as 'computer program code' (which may be grouped in the form of computer programs or other groupings), when executed, enable the computing system 1400 to perform functions of embodiments of the present invention. Note that the code may directly cause the processor to perform specified operations, be compiled to do so, and/or be combined with other software, hardware, and/or firmware elements (e.g., libraries for performing standard functions) to do so.

In an embodiment where the elements are implemented using software, the software may be stored in a computer-readable medium and loaded into computing system 1400 using, for example, removable storage drive 1422, drive 1412 or communications interface 1424. The control logic (in this example, software instructions or computer program code), when executed by the processor 1404, causes the processor 1404 to perform the functions of the invention as described herein.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

The present invention is herein described with reference to an integrated circuit device comprising, say, a microprocessor configured to perform the functionality of a polar encoder. However, it will be appreciated that the present invention is not limited to such integrated circuit devices, and may equally be applied to integrated circuit devices comprising any alternative type of operational functionality. Examples of such integrated circuit device comprising alternative types of operational functionality may include, by way of example only, application-specific integrated circuit (ASIC) devices, field-programmable gate array (FPGA) devices, or integrated with other components, etc. Furthermore, because the illustrated embodiments of the present invention may for the most part, be implemented using electronic components and circuits known to those skilled in the art, details have not been explained in any greater extent than that considered necessary, for the understanding and appreciation of the underlying concepts of the present invention and in order not to obfuscate or distract from the teachings of the present invention. Alternatively, the circuit and/or component examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired polar encoding by operating in accordance with suitable program code, such as minicomputers, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

REFERENCES

[1] E. Arikan, "Channel polarization: A method for constructing capacity-achieving codes for symmetric binary-input memoryless channels," IEEE Transactions on Information Theory, vol. 55, no. 7, pp. 3051-3073, July 2009.
[2] K. Niu and K. Chen, "Crc-aided decoding of polar codes," IEEE Communications Letters, vol. 16, no. 10, pp. 1668-1671, October 2012.
[3] Huawei, HiSilicon, "Polar code construction for NR," in 3GPP TSG RAN WG1 Meeting #86bis, Lisbon, Portugal, October 2016, R1-1608862.
[4] "Evaluation of channel coding schemes for control channel," in 3GPP TSG RAN WG1 Meeting #86bis, Lisbon, Portugal, October 2016, R1-1608863.
[5] CATT, "Polar codes design for eMBB control channel," in 3GPP TSG RAN WG1 AH NR Meeting, Spokane, USA, January 2017, R1-1700242.
[6] ZTE, ZTE Microelectronics, "Rate matching of polar codes for eMBB," in 3GPP TSG RAN WG1 Meeting #88, Athens, Greece, February 2017, R1-1701602.
[7] H. Yoo and I. C. Park, "Partially parallel encoder architecture for long polar codes," IEEE Transactions on Circuits and Systems II: Express Briefs, vol. 62, no. 3, pp. 306-310, March 2015.
[8] G. Sarkis, I. Tal, P. Giard, A. Vardy, C. Thibeault, and W. J. Gross, "Flexible and low-complexity encoding and decoding of systematic polar codes," IEEE Transactions on Communications, vol. 64, no. 7, pp. 2732-2745, July 2016.

We claim:
1. A polar encoder kernal configured to:
receive one or more bits from a kernal information block having a kernal block size of N; and
output one or more bits from a kernal encoded block having a block size that matches the kernal block size, N;
wherein the polar encoder kernal comprises a decomposition of a polar code graph into multiple columns that are processed by a reused single datapath utilised in each step of the encoding process irrespective of the kernal block size, at least one of said multiple columns contains two or more stages and where each column of the multiple columns is further decomposed into one or more polar code sub-graphs and is configured to perform the processing associated with one polar code sub-graph at a time.

2. The polar encoder of claim 1, wherein the polar encoder kernal comprises a datapath, memory blocks and a controller wherein the controller is configured to, when performing the processing associated with each polar code sub-graph, read $n_e$ bits from a first memory block of the memory or from a bit input to the polar encoder kernal, use the datapath to process the $n_e$ bits and write the resultant $n_e$ bits to a second memory block.

3. The polar encoder of claim 2, wherein the one or more sub-graphs within each column are processed by the datapath one at a time, spread over a corresponding number of successive processing steps, and wherein a number of decomposed sub-graphs in each column is dependent on the block size of the datapath $n_e$, where the block size of each sub-graph is equal to the block size of the datapath $n_e$, such that the datapath is able to process the sub-graph in a single step.

4. The polar encoder of claim 3, wherein a maximum number of decomposed sub-graphs in each column is max$(N/n_e, 1)$, and when $N<n_e$, at least one zero-valued bit is appended onto an end of the kernal information block to increase its length to $n_e$.

5. The polar encoder of claim 2, wherein the datapath and memory have the same bit widths and wherein a bit width of an input and a bit width of an output of the polar encoder kernal are selected independently from at least one of: each other, the datapath and memory.

6. The polar encoder of claim 5, wherein the datapath comprises at least one of: (i) a vertical concatenation of $n_e/2^{s_e}$ graphical representations of a first generator matrix $F^{\otimes s_e}$ having dimensions that depend on the number of datapath stages $s_e$, and (ii) the left-most $s_e$ stages in a graphical representation of a second generator matrix $F^{\otimes log_2(n_e)}$ having dimensions that depend on the datapath block size $n_e$.

7. The polar encoder of claim 5, wherein the datapath comprises a total of $s_e n_e/2$ XOR gates configured to propagate bits from a left edge of the datapath, through; datapath stages, to a right edge, along paths having a critical length comprising $s_e$ XOR gates and wherein a number of right-most stages in the datapath are disabled when performing processing associated with columns in which the number of stages $s_c$ is smaller than a number of datapath stages $s_e$.

8. The polar encoder of claim 2, wherein the processing associated with each successive column is performed by alternating between (i) reading from the first memory block and writing into the second memory block; and (ii) reading from the second memory block and writing into the first memory block.

9. The polar encoder of claim 8, wherein the controller provides individual write-enable signals to control whether each of the $n_e$ bits provided by the datapath is written individually into the first memory block or second memory block.

10. The polar encoder of claim 9, wherein the individual write enable signals used for the first memory block are shared with the second memory block, but masked alternately when performing the processing associated with successive columns.

11. The polar encoder of claim 1, wherein the polar encoder kernal is configured to perform the processing associated with all of the polar code sub-graphs within each successive column before advancing to the next column of the polar code graph in order, from left to right.

12. The polar encoder of claim 1, wherein the one or more sub-graphs within each column are configured to span the width of the column.

13. The polar encoder of claim 1, wherein the polar code graph is composed of a number (n=log 2(N)) of stages that are grouped into a number, C of columns, where each column comprises a number of consecutive stages, and wherein the 'n' stages are distributed among the number of C columns using any combination that satisfies $s_c \geq s_e$ for all $c \in [0, C-1]$, where $s_e$ specifies the maximum number of stages supported by the datapath.

14. The polar encoder of claim 13, wherein the number of columns $s_c = s_e$ for all but the right-most column, and where all remaining stages are placed into a right-most column.

15. The polar encoder of claim 1, wherein the polar encoder kernal is coupled to an information block conditioning circuit configured to:
receive one or more bits of an information block of data, having a block size of K to be encoded;
generate redundant bits and interlace the redundant bits into positions that are known by a polar decoder; and
output one or more bits from the kernal information block having a block size of N to the polar encoder kernal.

16. The polar encoder of claim 1, wherein successive kernal information blocks have kernal block sizes N that can vary from block to block.

17. A communication unit comprises a polar encoder kernal configured to:
receive one or more bits from a kernal information block having a kernal block size of N; and
output one or more bits from a kernal encoded block having a block size that matches the kernal block size N;
wherein the polar encoder kernal comprises a decomposition of a polar code graph into multiple columns that are processed by a reused single datapath utilised in each step of the encoding process irrespective of the kernal block size, at least one of said multiple columns contains two or more stages and where each column of the multiple columns is further decomposed into one or more polar code sub-graphs and is configured to process encoded bits one polar code sub-graph at a time.

18. An integrated circuit for a wireless communication unit, the integrated circuit comprising a polar encoder kernal configured to:
receive one or more bits from a kernal information block having a kernal block size of N; and
output one or more bits from a kernal encoded block having a block size that matches the kernal block size N;
wherein the polar encoder kernal comprises a decomposition of a polar code graph into multiple columns that are processed by a reused single datapath utilised in each step of the encoding process irrespective of the kernal block size, at least one of said multiple columns contains two or more stages and where each column of the multiple columns is further decomposed into one or more polar code sub-graphs and is configured to process encoded bits one polar code sub-graph at a time.

19. A method of polar encoding in a communication unit, the method performed at a polar encoder kernal:
decomposing a polar code graph into multiple columns that are processed by a reused single datapath utilised in each step of the encoding process irrespective of the kernal block size, at least one of said multiple columns contains two or more stages and where each column of the multiple columns is further decomposed into one or more polar code sub-graphs;
receiving one or more bits from a kernal information block having a kernal block size of N;
processing encoded bits one polar code sub-graph at a time; and
outputting one or more bits from a kernal encoded block having a block size that matches the kernal block size N.

20. A non-transitory tangible computer program product comprising executable code stored therein for polar encoding in a communication unit, wherein the code is operable for, when executed at a polar encoder kernal:
decomposing a polar code graph into multiple columns that are processed by a reused single datapath utilised in each step of the encoding process irrespective of the kernal block size, at least one of said multiple columns contains two or more stages and where each column of the multiple columns is further decomposed into one or more polar code sub-graphs;
receiving one or more bits from a kernal information block having a kernal block size of N;
processing encoded bits one polar code sub-graph at a time; and
outputting one or more bits from a kernal encoded block having a block size that matches the kernal block size, N.

* * * * *